(12) United States Patent
Marutani

(10) Patent No.: US 7,965,808 B2
(45) Date of Patent: Jun. 21, 2011

(54) FREQUENCY DIVIDING DEVICE

(75) Inventor: Masazumi Marutani, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 45 days.

(21) Appl. No.: 12/472,961

(22) Filed: May 27, 2009

(65) Prior Publication Data

US 2009/0302900 A1 Dec. 10, 2009

(30) Foreign Application Priority Data

Aug. 6, 2008 (JP) .................................. 2008-202786

(51) Int. Cl.
*H03K 21/00* (2006.01)

(52) U.S. Cl. ............................................. 377/47; 377/48

(58) Field of Classification Search .................... None
See application file for complete search history.

(56) References Cited

U.S. PATENT DOCUMENTS

| | | | | |
|---|---|---|---|---|
| 5,510,742 A * | 4/1996 | Lemaire | ........................ | 327/146 |
| 6,157,694 A * | 12/2000 | Larsson | ........................ | 377/48 |
| 6,542,013 B1 * | 4/2003 | Volk et al. | ........................ | 327/115 |
| 6,583,674 B2 * | 6/2003 | Melava et al. | ........................ | 331/16 |
| 6,671,341 B1 * | 12/2003 | Kinget et al. | ........................ | 375/373 |
| 7,035,367 B2 * | 4/2006 | Melava | ........................ | 375/376 |
| 2003/0068003 A1 * | 4/2003 | Casagrande | ........................ | 377/47 |
| 2004/0239434 A1 | 12/2004 | Casagrande | | |
| 2008/0094113 A1 * | 4/2008 | Kuan | ........................ | 327/117 |
| 2008/0164917 A1 | 7/2008 | Floyd et al. | | |

FOREIGN PATENT DOCUMENTS

| | | |
|---|---|---|
| JP | 07314248 | 12/1995 |
| JP | 10032486 | 2/1998 |
| JP | 2004201169 | 7/2004 |

OTHER PUBLICATIONS

European Search Report issued in 09161621.9-2206 dated Nov. 9, 2009.
Nagendra Krishnapura et al., "A 5.3-GHz Programmable Divider for HiPerLAN in 0.25-μm CMOS" IEEE Journal of Solid-State Circuits, vol. 35, No. 7, pp. 1019-1024; Jul. 2000.
Jan Craninckx, et al., "A 1.75-GHz/3-V Dual-Modulus Divide-by-128/129 Prescaler in 0.7-μm CMOS" IEEE Journal of Solid-State Circuits, vol. 31, No. 7, pp. 890-897; Jul. 1996.

* cited by examiner

Primary Examiner — Tuan Lam
(74) Attorney, Agent, or Firm — Fujitsu Patent Center

(57) ABSTRACT

In a frequency dividing device, a 1/P frequency divider subjects an input clock signal to 1/P frequency division. A phase shifter shifts the phase of the 1/P frequency signal and outputs multiple different Q-phase signals. A switch controls phase shifting in accordance with a division ratio control signal, to switch the Q-phase signals from one to another. A 1/R frequency divider subjects the output from the switch to 1/R frequency division and outputs an Rth frequency clock signal. A ½ frequency divider subjects the Rth frequency clock signal to ½ frequency division and outputs a frequency divided clock signal. A division ratio setter receives a division ratio set signal and generates the division ratio control signal. As a division ratio, $P \times R \times 2 - 2 \times P/Q$, $P \times R \times 2 - P/Q$, $P \times R \times 2$, $P \times R \times 2 + P/Q$, and $P \times R \times 2 + 2 \times P/Q$ can be set.

6 Claims, 28 Drawing Sheets

| Division ratio | Division ratio set signal DIVSET | | | Decoded value | | |
|---|---|---|---|---|---|---|
| | | | | Polarity bit b1 | Division ratio set bit b2 | Division ratio set bit b3 |
| 6 | 0 | 1 | 0 | 0 | 1 | 1 |
| 7 | 0 | 1 | 1 | 0 | 0 | 1 |
| 8 | 1 | 0 | 0 | 0 | 0 | 0 |
| 9 | 1 | 0 | 1 | 1 | 0 | 1 |
| 10 | 1 | 1 | 0 | 1 | 1 | 1 |

FIG. 4

INTERMEDIATE LEVEL INPUT TO TERMINAL D

IDENTICAL PHASE OUTPUT

FREQUENCY DIVIDING DEVICE

CROSS-REFERENCE TO RELATED APPLICATIONS

This application is based upon and claims the benefit of priority of the prior Japanese Patent Application No. 2008-202786, filed on Aug. 6, 2008, the entire contents of which are incorporated herein by reference.

FIELD

The embodiments discussed herein are related to frequency dividing devices for performing variable frequency division.

BACKGROUND

In the field of wireless communications such as television broadcasting and mobile phone communication, development of circuit technology using CMOS (Complementary Metal Oxide Semiconductor) devices are actively pursued. Also, synthesizer circuits are widely used in the field of wireless communications and are being designed on the level of CMOS process to develop synthesizer circuits with necessary characteristics, such as low noise, wide band, and low power consumption.

The synthesizer circuit is used to generate a local clock signal necessary for transmitting/receiving signals and includes a variable frequency divider therein. FIG. 23 illustrates the configuration of a conventional variable frequency divider. The variable frequency divider 100 comprises a clock source 101, a pre-divider 102, a phase shifter 103, and a divided clock signal generator 104.

The clock source 101 generates an input clock signal ck, and the pre-divider 102 divides the frequency of the input clock signal ck. The phase shifter 103 shifts the phase of the frequency divided clock signal to 0°, 90°, 180° and 270° to generate clock signals d1 to d4 with the respective phases, and outputs the generated clock signals from four ports, respectively.

On receiving a division ratio set signal indicative of an instructed division ratio to be set, the divided clock signal generator 104 generates a signal with the instructed division ratio from the clock signals d1 to d4, and outputs the generated signal as a frequency divided clock signal dout.

The variable frequency divider 100 performs the frequency division basically as follows: The frequency of the input clock signal ck is divided in a preset division ratio, then the phase of the thus-obtained clock signal is shifted to generate the four clock signals d1 to d4 with respective different phases, and logical operation is performed on predetermined ones of the clock signals to generate the frequency divided clock signal dout.

Generation of fifth (⅕) and third (⅓) frequency clock signals will be explained below as examples of the conventional frequency division. In the following, the operation of dividing the frequency of the input clock signal to generate a signal with a period (one clock period) corresponding to N clock periods of the input clock signal is referred to as 1/N frequency division (or Nth frequency division), and the clock signal obtained by subjecting the input clock signal to 1/N frequency division is referred to as Nth frequency clock signal. For example, the operation of dividing the frequency of the input clock signal to generate a signal with a period corresponding to two clock periods of the input clock signal is expressed as follows: The input clock signal is subjected to ½ frequency division to generate a second frequency clock signal.

FIG. 24 illustrates the manner of deriving a fifth frequency clock signal with fifth frequency division set by the division ratio set signal. The pre-divider 102 subjects the input clock signal ck to ¼ frequency division to generate a fourth frequency clock signal. The phase shifter 103 shifts the phase of the received fourth frequency clock signal every 90° and outputs clock signals d1 to d4 with phases 0°, 90°, 180° and 270°, respectively.

It is assumed that when the logical level of the clock signal da (a=1 to 4) and the logical level of the clock signal db (b=a+1 (when a=1, 2 or 3), b=1 (when a=4)) are both High, phase switching timing is generated, so that the divided clock signal generator 104 switches the phase by 90° (if the switching direction is positive, 0°→90°→180°→270°→0°→ ... ).

t1: "t1" is a phase switching time interval over which the clock signals d1 (0) and d2 (90) both remain at the High level and during which switchover from the clock signal d1 (0) to the clock signal d2 (90) is performed.

Thus, before the phase switching time interval t1, the clock signal d1 (0) is output from the divided clock signal generator 104, and during the phase switching time interval t1, the High level is output from the divided clock signal generator 104. From the phase switching time interval t1 through to the next phase switching time interval t2, the switched clock signal d2 (90) is output from the divided clock signal generator 104.

t2: "t2" is a phase switching time interval over which the clock signals d2 (90) and d3 (180) both remain at the High level and during which switchover from the clock signal d2 (90) to the clock signal d3 (180) is effected.

Accordingly, during the phase switching time interval t2, the High level is output from the divided clock signal generator 104, and from the phase switching time interval t2 through to the next phase switching time interval t3, the switched clock signal d3 (180) is output from the divided clock signal generator 104.

t3: "t3" is a phase switching time interval over which the clock signals d3 (180) and d4 (270) both remain at the High level and during which switchover from the clock signal d3 (180) to the clock signal d4 (270) is carried out.

Thus, during the phase switching time interval t3, the High level is output from the divided clock signal generator 104, and from the phase switching time interval t3 through to the next phase switching time interval t4, the switched clock signal d4 (270) is output from the divided clock signal generator 104.

t4: "t4" is a phase switching time interval over which the clock signals d4 (270) and d1 (0) both remain at the High level and during which switchover from the clock signal d4 (270) to the clock signal d1 (0) is performed.

Accordingly, during the phase switching time interval t4, the High level is output from the divided clock signal generator 104, and from the phase switching time interval t4 through to the next phase switching time interval t1, the switched clock signal d1 (0) is output from the divided clock signal generator 104. The same operation as described above is repeated thereafter.

The frequency divided clock signal dout output from the divided clock signal generator 104 contains five input clock pulses ck in one period thereof, revealing that a fifth frequency clock signal is generated. The phase 90° of each fourth frequency clock signal corresponds to one period of the input clock signal ck, and thus one period of the fourth frequency clock signal contains four periods of the input clock signal ck.

Thus, by causing the divided clock signal generator 104 to perform a phase shift of +90° with respect to the fourth frequency clock signals, it is possible to obtain a frequency divided clock signal dout of which one period contains five (=4+1) periods of the input clock signal ck.

FIG. 25 illustrates the manner of obtaining a third frequency clock signal with third frequency division set by the division ratio set signal. It is assumed that when the logical levels of the two clock signals da and db are both High, the phase switching timing is generated, so that the divided clock signal generator 104 switches the phase by 90° in the negative direction (0°→270°→180°→90°→0°→ . . . ).

t11: "t11" is a phase switching time interval over which the clock signals d1 (0) and d4 (270) both remain at the High level and during which switchover from the clock signal d1 (0) to the clock signal d4 (270) is performed.

Thus, during the phase switching time interval t11, the High level is output from the divided clock signal generator 104, and from the phase switching time interval t11 through to the next phase switching time interval t12, the switched clock signal d4 (270) is output from the divided clock signal generator 104.

t12: "t12" is a phase switching time interval over which the clock signals d4 (270) and d3 (180) both remain at the High level and during which switchover from the clock signal d4 (270) to the clock signal d3 (180) is effected.

Accordingly, during the phase switching time interval t12, the High level is output from the divided clock signal generator 104, and from the phase switching time interval t12 through to the next phase switching time interval t13, the switched clock signal d3 (180) is output from the divided clock signal generator 104.

t13: "t13" is a phase switching time interval over which the clock signals d3 (180) and d2 (90) both remain at the High level and during which switchover from the clock signal d3 (180) to the clock signal d2 (90) is carried out.

Thus, during the phase switching time interval t13, the High level is output from the divided clock signal generator 104, and from the phase switching time interval t13 through to the next phase switching time interval t14, the switched clock signal d2 (90) is output from the divided clock signal generator 104.

t14: "t14" is a phase switching time interval over which the clock signals d2 (90) and d1 (0) both remain at the High level and during which switchover from the clock signal d2 (90) to the clock signal d1 (0) is performed.

Accordingly, during the phase switching time interval t14, the High level is output from the divided clock signal generator 104, and from the phase switching time interval t14 through to the next phase switching time interval t11, the switched clock signal d1 (0) is output from the divided clock signal generator 104. The same operation as described above is repeated thereafter.

The frequency divided clock signal dout output from the divided clock signal generator 104 contains three input clock pulses ck in one period thereof, indicating that a third frequency clock signal is generated. The phase 90° of each fourth frequency clock signal corresponds to one period of the input clock signal ck, and one period of the fourth frequency clock signal contains four periods of the input clock signal ck. Thus, by causing the divided clock signal generator 104 to perform a phase shift of −90° with respect to the fourth frequency clock signals, it is possible to derive a frequency divided clock signal dout of which one period contains three (=4−1) periods of the input clock signal ck.

As a conventional technique, there has been proposed a frequency divider in which output patterns obtained by dividing the frequency of a reference clock signal in predetermined ratios are stored beforehand and, in accordance with the generation pattern of the input reference clock signal, a corresponding output pattern is read out to output a frequency divided signal (see, e.g., Japanese Laid-open Patent Publication No. 07-314248 (paragraph nos. [0035] to [0037], FIG. 1)).

As explained above, in the variable frequency divider 100, the divided clock signal generator 104 internally performs the phase switching to generate the frequency divided clock signal dout. In order to variably set the division ratio as desired, however, complicated timing control is needed for the phase switching, and it has been difficult to carry out variable frequency division in a desired division ratio by using only a digital circuit with simple configuration.

In most of conventional variable frequency dividers, necessary frequency division patterns are prepared beforehand as embedded software, for example, to implement variable frequency division, as in the above conventional technique (Japanese Laid-open Patent Publication No. 07-314248). Accordingly, there has been a demand for variable frequency dividers constituted by a small number of circuit elements and capable of performing predetermined frequency division operations.

Meanwhile, in the variable frequency divider 100, where the phase switching timing is generated when the clock signals da and db are both at the same logical level, as explained above with reference to FIGS. 22 and 23, a frequency divided clock signal dout free of waveform degradation is output (although in the above, High level is exemplified as the logical level, the frequency division is also normally performed in the case where the phase switching timing is generated when the two clock signals da and db are both at the Low level).

If the phase switching timing deviates, however, a problem arises in that the waveform of the frequency divided clock signal dout degrades. Referring now to FIGS. 24 and 25, waveform degradation of the frequency divided clock signal dout attributable to deviation of the phase switching timing will be explained.

Let us consider the case where, with respect to the clock signals d1 to d4 output from the phase shifter 103, the divided clock signal generator 104 performs a phase shift of +90° from the currently output clock signal da (a=1 to 4) to the clock signal db (b=a+1 (when a=1, 2 or 3), b=1 (when a=4)) for the phase switching.

FIG. 26 illustrates phase switching accompanying pulse splitting, or more specifically, timing waveforms while a frequency divided clock signal dout1 with waveform degradation is output from the divided clock signal generator 104. In this example, the phase switching timing is generated when the logical levels of the clock signals da and db are High and Low, respectively.

Phase Switching At Timing t21: The divided clock signal generator 104 performs switchover from 0° to 90° while the clock signal d1 (0) is being output. Suppose that, in this case, phase switching timing t21 is generated when the logical levels of the clock signals d1 (0) and d2 (90) are High and Low, respectively, with the result that the clock signal is switched from the clock signal d1 (0) to the clock signal d2 (90).

From the timing t21 through to the next switching timing t22, the switched clock signal d2 (90) is output as the frequency divided clock signal dout1 (before the timing t21, the clock signal d1 (0) is output as the frequency divided clock signal dout1).

Phase Switching at Timing t22: The divided clock signal generator 104 performs switchover from 90° to 180° when the clock signal d2 (90) is being output. If, in this case, the phase switching timing t22 is generated when the clock signals d2 (90) and d3 (180) are High and Low, respectively, the clock signal is switched from the clock signal d2 (90) to the clock signal d3 (180). As a result, from the timing t22 through to the next switching timing t23, the switched clock signal d3 (180) is output as the frequency divided clock signal dout1.

Phase Switching at Timing t23: The divided clock signal generator 104 performs switchover from 180° to 270° while the clock signal d3 (180) is output. In this case, if the phase switching timing t23 is generated when the clock signals d3 (180) and d4 (270) are High and Low, respectively, the clock signal is switched from the clock signal d3 (180) to the clock signal d4 (270). Consequently, from the timing t23 through to the next switching timing, the switched clock signal d4 (270) is output as the frequency divided clock signal dout1.

If the phase switching timing is generated when the logical levels of the clock signals da and db are High and Low, respectively, pulse splitting occurs in the frequency divided clock signal dout1, as illustrated in FIG. 26, so that the frequency divided clock signal dout1 has a degraded waveform, compared with the frequency divided clock signal dout obtained while the frequency division is performed normally. Also, because of the waveform degradation, the frequency divided clock signal dout1 contains two pulses a0-1 and a0-2 per period a0 of the frequency divided clock signal dout, and thus the frequency division performed is not a desired one.

FIG. 27 illustrates phase switching accompanying pulse splitting, or more specifically, timing waveforms while a frequency divided clock signal dout2 with waveform degradation is output from the divided clock signal generator 104. In this example, the phase switching timing (t24 to t26) is generated when the logical levels of the clock signals da and db are Low and High, respectively (since the basic operation of the phase switching is identical with that explained above with reference to FIG. 26, description thereof is omitted).

If the phase switching timing is generated when the logical levels of the clock signals da and db are Low and High, respectively, as illustrated in FIG. 27, pulse splitting occurs in the frequency divided clock signal dout2, and therefore, the frequency divided clock signal dout2 has a degraded waveform, compared with the frequency divided clock signal dout obtained during the normal frequency division. Also, due to the waveform degradation, the frequency divided clock signal dout2 contains two pulses b0-1 and b0-2 per period b0 of the frequency divided clock signal dout, and thus the frequency division performed is not a desired one.

Thus, in the variable frequency divider, pulse splitting occurs in the frequency divided clock signal dout unless the phase switching is executed at proper timing. It is therefore necessary to perform phase shift control at such timing that the pulse splitting is avoided.

Further, since the variable frequency divider 100 is constituted by a digital circuit, there is another problem that glitch, which is commonly observed in digital circuits, may possibly be caused. Glitch denotes a transient noise pulse.

FIG. 28 illustrates an example of how glitch occurs. An AND gate is input with signals c1 and c2 and outputs a signal c3. At a change point of the input signals c1 and c2, the input signal c1 changes from Low to High while the input signal c2 changes from High to Low, for example, and because of a time difference between the input signals c1 and c2, an unwanted pulse (glitch) is output as the output signal c3. Glitch is a cause of malfunction, and therefore, the circuit needs to be designed so as to remove the cause of occurrence of glitch.

SUMMARY

According to one aspect of the embodiments, a frequency dividing device for performing variable frequency division includes a clock source configured to generate an input clock signal, a 1/P frequency divider configured to subject the input clock signal to 1/P frequency division to obtain a 1/P frequency signal, a phase shifter configured to shift phase of the 1/P frequency signal and output a plurality of different Q-phase signals, a switch configured to perform phase switching by switching the Q-phase signals from one to another in accordance with a division ratio control signal, a 1/R frequency divider configured to subject a switched clock signal output from the switch to 1/R frequency division and output an Rth frequency clock signal, a ½ frequency divider configured to subject the Rth frequency clock signal to ½ frequency division and output a frequency divided clock signal, and a division ratio setter configured to receive a division ratio set signal indicative of an externally instructed division ratio and generate, based on the division ratio set signal, the Rth frequency clock signal and the frequency divided clock signal, the division ratio control signal for controlling the phase switching, wherein P, Q, and R are integers satisfying $P \geq 1$, $Q \geq 3$ and $R \geq 1$, and the frequency dividing device allows any one of five values indicated by $P \times R \times 2$, $P \times R \times 2 \pm 1 \times P/Q$, and $P \times R \times 2 \pm 2 \times P/Q$ to be set as the division ratio in which frequency of the input clock signal is divided, and outputs the frequency divided clock signal with the set division ratio.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWING(S)

FIG. 4 illustrates the correspondence relationship between a division ratio set signal and decoded values;

Figure 27:
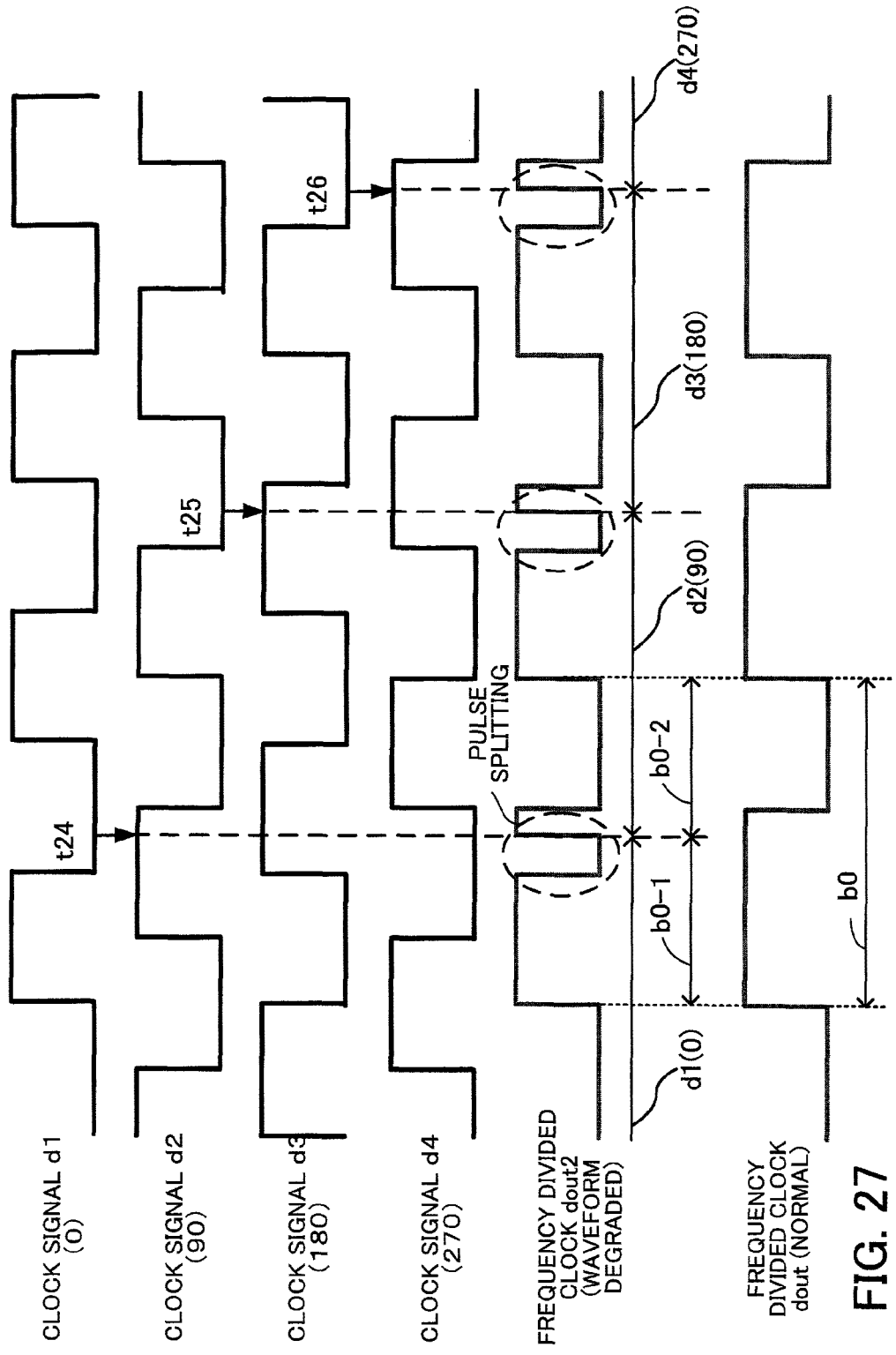

FIG. 27 also illustrates phase switching accompanying pulse splitting; and

Figure 28:
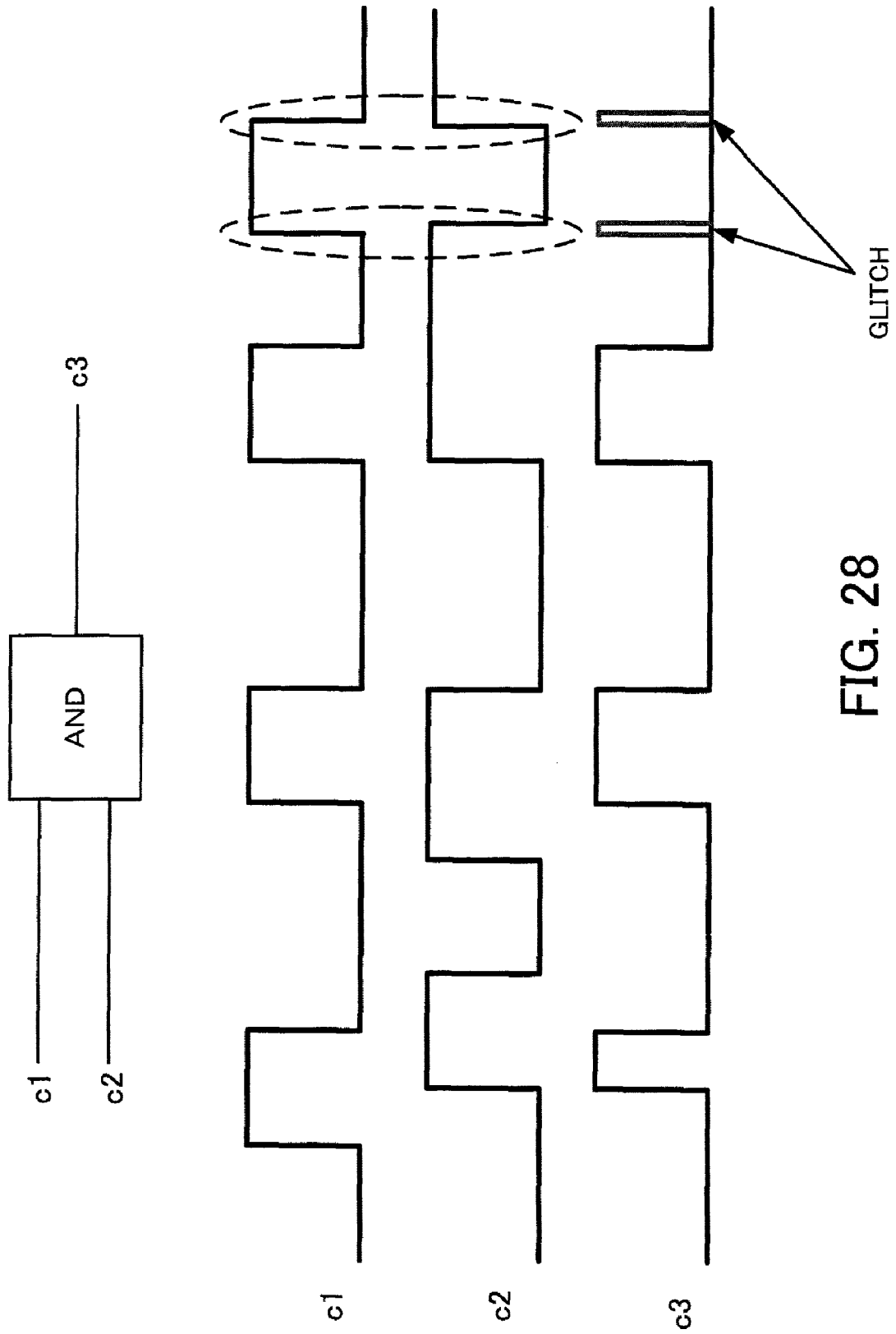

FIG. 28 illustrates an example of how glitch occurs.

DESCRIPTION OF EMBODIMENT(S)

Figure 1:
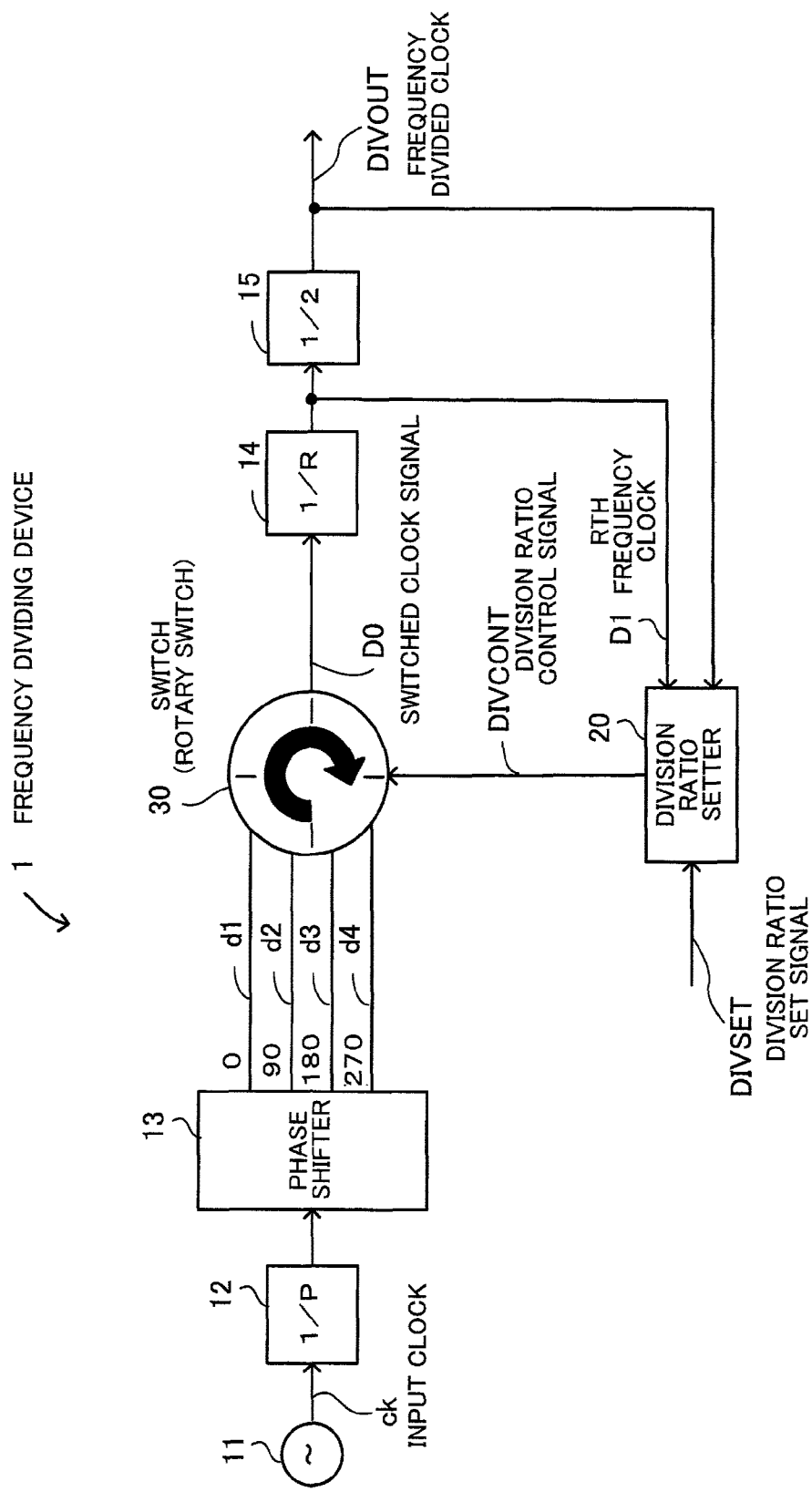
FIG. 1 illustrates the principle of a frequency dividing device.

Embodiments of the present invention will be described below with reference to the accompanying drawings, wherein like reference numerals refer to like elements throughout. FIG. 1 illustrates the principle of a frequency dividing device. The frequency dividing device 1 comprises a clock source 11, a 1/P frequency divider 12, a phase shifter 13, a 1/R frequency divider 14, a ½ frequency divider 15, a division ratio setter 20, and a switch 30 (hereinafter rotary switch 30).

The clock source 11 generates an input clock signal ck, and the 1/P frequency divider 12 subjects the input clock signal ck to 1/P frequency division to obtain a 1/P frequency signal. The phase shifter 13 shifts the phase of the 1/P frequency signal (Pth frequency clock signal) and outputs a plurality of different Q-phase signals. FIG. 1 exemplifies the case where Q=4. Thus, the phase of the Pth frequency clock signal is shifted to 0°, 90°, 180° and 270°, and the resulting four Pth frequency clock signals (clock signals d1 to d4) with the respective phases are output from respective ports.

In accordance with a division ratio control signal DIVCONT, the rotary switch 30 performs phase switching by switching between the Q-phase signals output from the phase shifter 13. Specifically, the rotary switch 30 selects and outputs one of the multiple clock signals d1 to d4 output from the phase shifter 13.

The 1/R frequency divider 14 subjects the output signal (switched clock signal D0) from the rotary switch 30 to 1/R frequency division and outputs an Rth frequency clock signal D1. The ½ frequency divider 15 subjects the Rth frequency clock signal D1 to ½ frequency division and outputs a frequency divided clock signal DIVOUT, which is a final output.

The division ratio setter 20 receives a division ratio set signal DIVSET, which is indicative of an externally instructed division ratio, and generates, based on three signals, namely, the division ratio set signal DIVSET, the Rth frequency clock signal D1 and the frequency divided clock signal DIVOUT, the division ratio control signal DIVCONT for controlling the phase switching (switching of the rotary switch 30).

In the above, P, Q and R represent integers satisfying $P \geq 1$, $Q \geq 3$, and $R \geq 1$, respectively. The clock signals d1 to d4 output from the phase shifter 13 have a division ratio of P with respect to the input clock signal ck (the clock signals d1 to d4 are obtained by subjecting the input clock signal ck to 1/P frequency division and then shifting the phase of the resulting signal every 90°). The frequency divided clock signal DIVOUT has a division ratio of R×2 with respect to the switched clock signal D0 (the frequency divided clock signal DIVOUT is obtained by subjecting the switched clock signal D0 to 1/(R×2) frequency division).

Also, each time the rotary switch 30 makes a phase shift in the positive direction (0°→90°→180°→270°→0° . . . ) or the negative direction (0°→270°→180°→90°→0°→ . . . ), the period of the output signal varies in the positive or negative direction by P/Q clock periods with respect to the input clock signal ck.

As the division ratio in which the frequency of the input clock signal ck is divided, the frequency dividing device 1 can set any one of five values indicated by P×R×2, P×R×2±1×P/Q, and P×R×2±2×P/Q, namely, (P×R×2−2×P/Q), (P×R×2−1×P/Q), (P×R×2), (P×R×2+1×P/Q), and (P×R×2+2×P/Q). Thus, a frequency divided clock signal with one of these division ratios can be output as DIVOUT.

Where P=4, Q=4 and R=1, for example, P×R×2=8, P×R×2±1×P/Q=8±1=9 and 7, and P×R×2±2×P/Q=8±2=10 and 6. Accordingly, five values (6, 7, 8, 9, 10) can be set as the division ratio.

Namely, in the case where P=4, Q=4 and R=1, it is possible to output, as the frequency divided clock signal DIVOUT, one of an eighth frequency clock signal obtained by subjecting the input clock signal ck to ⅛ frequency division, a ninth frequency clock signal obtained by subjecting the input clock signal ck to ⅑ frequency division, a seventh frequency clock signal obtained by subjecting the input clock signal ck to ⅐ frequency division, a tenth frequency clock signal obtained by subjecting the input clock signal ck to 1/10 frequency division, and a sixth frequency clock signal obtained by subjecting the input clock signal ck to ⅙ frequency division. One of the division ratios (6, 7, 8, 9, 10) to be selected is instructed by the division ratio set signal DIVSET.

On the other hand, where P=4, Q=4 and R=2, for example, P×R×2=16, P×R×2±1×P/Q=16±1=17 and 15, and P×R×2±2×P/Q=16±2=18 and 14. Thus, in this case, five values (14, 15, 16, 17, 18) can be set as the division ratio.

Further, fractions can also be set as the division ratio. Where P=2, Q=3 and R=3, for example, P×R×2=12, P×R×2±1×P/Q=12±2/3=38/3 and 34/3, and P×R×2±2×P/Q=40/3 and 32/3. In this case, therefore, five values (32/3, 34/3, 12, 38/3, 40/3) can be set as the division ratio.

The division ratio setter 20 will be now described. The division ratio setter 20 generates the division ratio control signal DIVCONT by using the division ratio set signal DIVSET, the Rth frequency clock signal D1 derived by subjecting the switched clock signal D0 output from the rotary switch 30 to 1/R frequency division, and the frequency divided clock signal DIVOUT derived by subjecting the Rth frequency clock signal D1 to ½ frequency division, to set one of the five division ratios.

Figure 2:
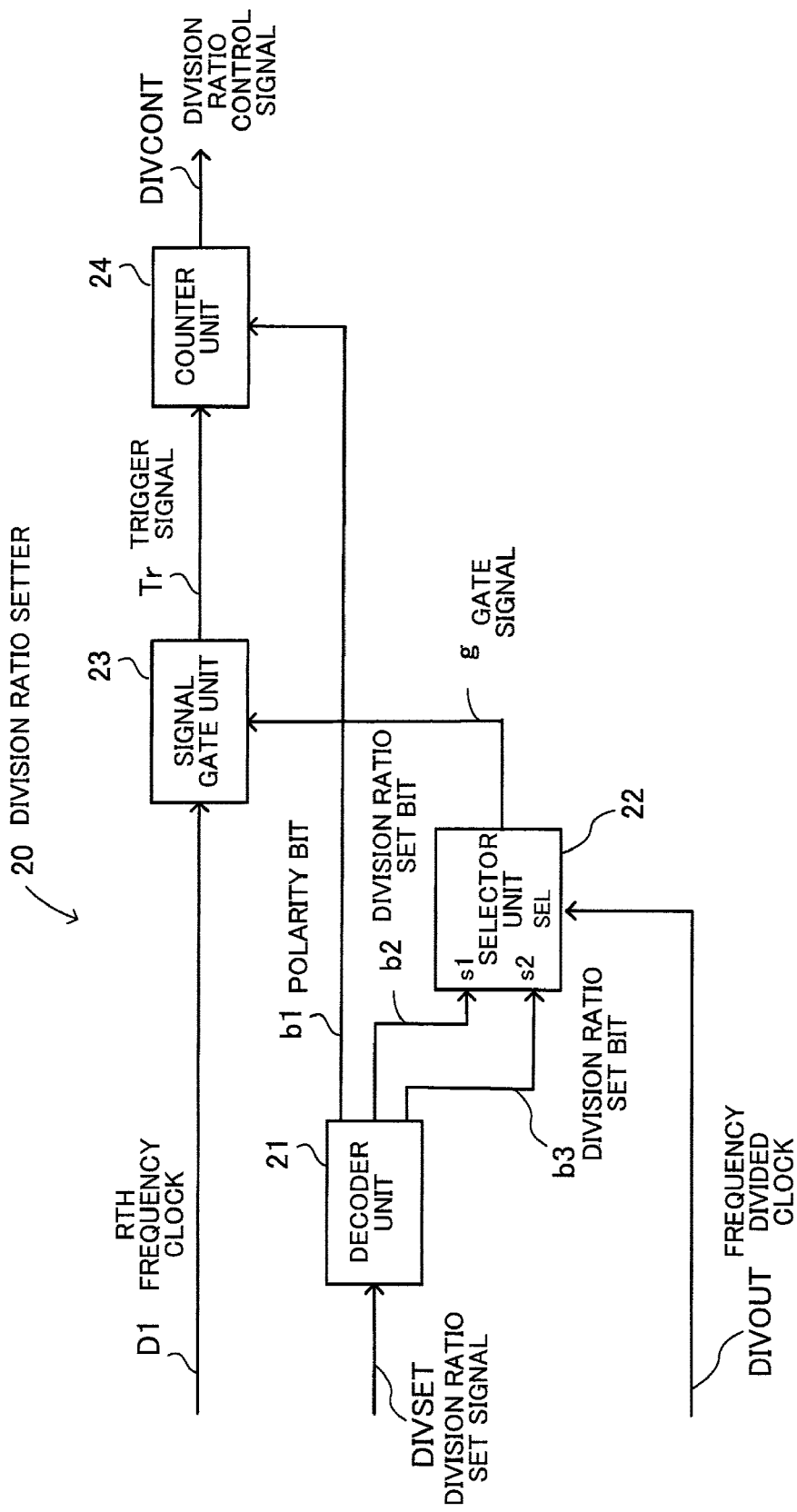
FIG. 2 illustrates the configuration of a division ratio setter.

FIG. 2 illustrates the configuration of the division ratio setter 20. The division ratio setter 20 comprises a decoder unit 21, a selector unit 22, a signal gate unit 23, and a counter unit 24. The decoder unit 21 decodes the division ratio set signal DIVSET externally applied thereto and outputs a polarity bit b1 and division ratio set bits b2 and b3.

The selector unit 22 has input terminals s1 and s2 input with the division ratio set bits b2 and b3, respectively, and has a select terminal SEL input with the frequency divided clock signal DIVOUT output from the ½ frequency divider 15. The selector unit 22 selects one of the division ratio set bits b2 and b3 in accordance with the level of the frequency divided clock signal DIVOUT, and outputs the selected bit as a gate signal g.

Specifically, when the frequency divided clock signal DIVOUT is High, the division ratio set bit b2 input to the input terminal s1 is selected and output as the gate signal g. When the frequency divided clock signal DIVOUT is Low, the division ratio set bit b3 input to the input terminal s2 is selected and output as the gate signal g.

The signal gate unit 23 passes or holds the Rth frequency clock signal D1 in accordance with the logical level of the gate signal g. Specifically, when the gate signal g is High, the Rth frequency clock signal D1 is passed through to be supplied to the counter unit 24 as a trigger signal Tr. When the gate signal g is Low, passage of the Rth frequency clock signal D1 is blocked.

The counter unit 24 generates a count value based on the trigger signal Tr and outputs the count value, as the division ratio control signal DIVCONT, to the rotary switch 30. Also, in accordance with the logical level of the polarity bit b1, the counter unit 24 increments or decrements its count value.

Let it be assumed here that the count value and the phase have a correspondence relationship of (00, 01, 10, 11)=(0°, 90°, 180°, 270°), for example, and that the count value is incremented when the polarity bit b1 is "1" and is decremented when the polarity bit b1 is "0".

In this case, if the count value is incremented as 00→01→10→11, the phase changes as 0°→90°→180°→270°. Conversely, if the count value is decremented as 00→11→10→01, the phase changes as 0°270°→180°→90°.

In this manner, the count value correlated with the phase is varied in response to the trigger signal Tr in the incremental or decremental direction selected in accordance with the polarity bit b1, to generate the division ratio control signal DIVCONT.

This makes it possible to instruct the rotary switch 30, with the use of the value of the division ratio control signal DIVCONT, to perform variable frequency division such that the period of the output signal is varied in the positive or negative direction by P/Q clock periods of the input clock signal ck.

In the above example, the correspondence relationship of (00, 01, 10, 11)=(0°, 90°, 180°, 270°) is established between the count value, which is normal code, and the phase, for ease of understanding. In actual design, however, gray code is used for the count value, and a correspondence relationship of (00, 01, 11, 10)=(0°, 90°, 180°, 270°) is established between the count value and the phase.

Gray code has the feature that there always occurs a change of one bit only when the number changes from a certain value to its adjacent one. With normal code, when the phase changes from 90° to 180°, for example, the count value changes from "01" to "10", namely, the LSB of "01" changes from "1" to "0" while the MSB of "01" changes from "0" to "1", requiring a two-bit change. With gray code, on the other hand, the count value changes from "01" to "11", namely, the LSB of "01" remains unchanged while only the MSB of "01" changes from "0" to "1", requiring a one-bit change.

In this manner, with normal code, a plurality of bits often change when a certain value changes to its adjacent value, and since perfectly simultaneous change of these bits is not guaranteed, the probability of error is high. With gray code, only one bit changes at a time, making it possible to restrain the occurrence of error (the use of gray code is more effective where the number of bits is greater).

Figure 3:
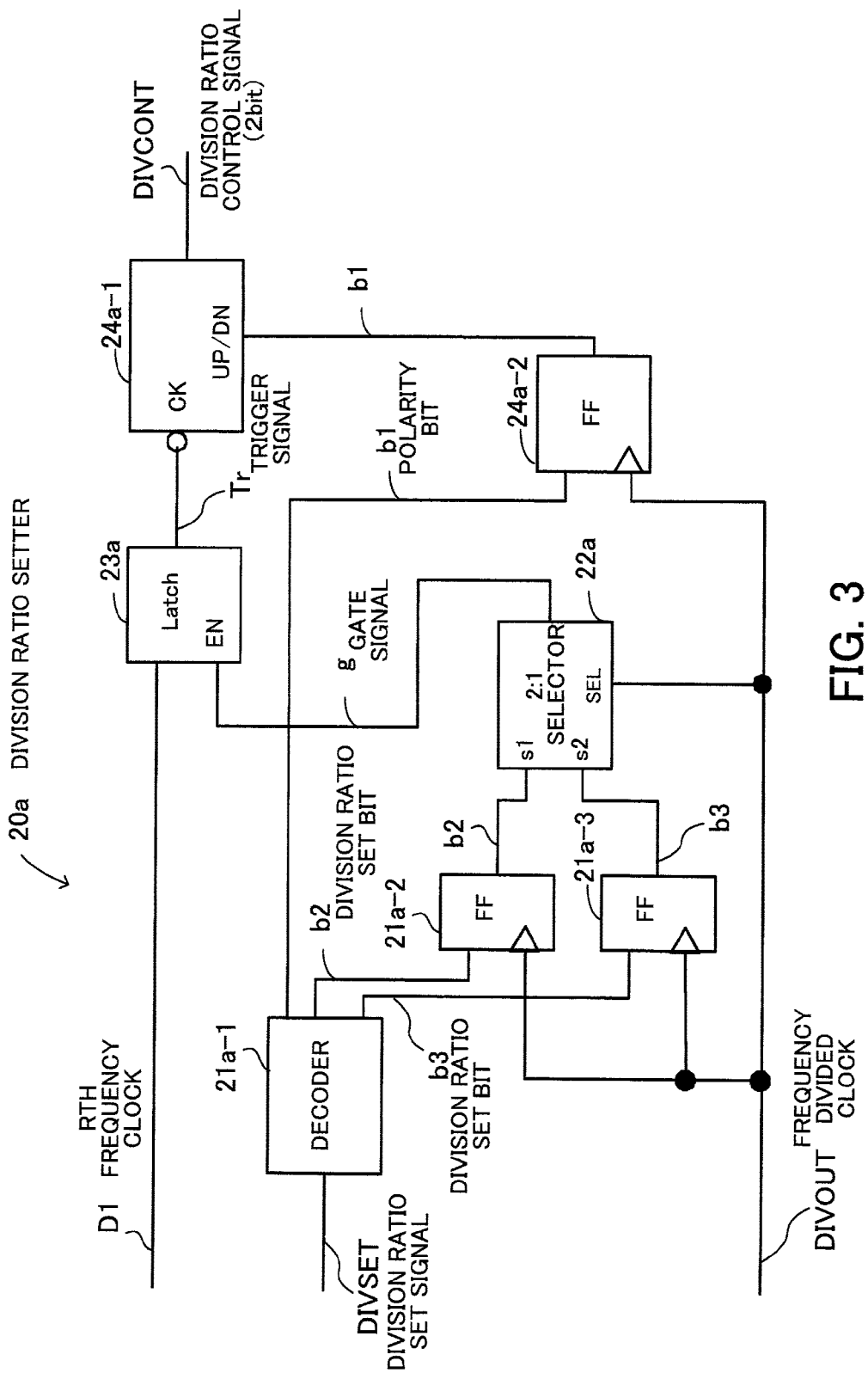
FIG. 3 is a detailed circuit block diagram of the division ratio setter.

FIG. 3 is a detailed circuit block diagram of the division ratio setter 20. A division ratio setter 20a comprises a decoder 21a-1, flip-flops (FF) 21a-2, 21a-3 and 24a-2, a 2:1 selector 22a, a latch 23a, and an up/down counter 24a-1.

The decoder 21a-1 and the flip-flops 21a-2 and 21a-3 altogether function as the decoder unit 21, and the 2:1 selector 22a corresponds to the selector unit 22. The latch 23a corresponds to the signal gate unit 23, and the up/down counter 24a-1 and the flip-flop 24a-2 function as the counter unit 24.

The decoder 21a-1 decodes the division ratio set signal DIVSET and outputs the polarity bit b1 and the division ratio set bits b2 and b3. The division ratio set bits b2 and b3 are input to the flip-flops 21a-2 and 21a-3, respectively, and the frequency divided clock signal DIVOUT is input to the clock terminals of the respective flip-flops 21a-2 and 21a-3.

The division ratio set bit b2 is latched by the flip-flop 21a-2 and then input to the input terminal s1 of the 2:1 selector 22a, and the division ratio set bit b3 is latched by the flip-flop 21a-3 and then input to the input terminal s2 of the 2:1 selector 22a. The frequency divided clock signal DIVOUT is input to the select terminal SEL of the 2:1 selector 22a.

The Rth frequency clock signal D1 is input to the latch 23a, of which the enable terminal EN is input with the gate signal g output from the 2:1 selector 22a. The polarity bit b1 is input to the flip-flop 24a-2, of which the clock terminal is input with the frequency divided clock signal DIVOUT.

The polarity bit b1 is latched by the flip-flop 24a-2 and then input to the up/down set terminal UP/DN of the up/down counter 24a-1. The trigger signal Tr output from the latch 23a is input to the trigger terminal CK of the up/down counter 24a-1. The division ratio control signal DIVCONT output from the up/down counter 24a-1 is sent to the rotary switch 30.

Operation of the division ratio setter 20 will be now described with reference to a specific example wherein P=4, Q=4, R=1, and one of the five values (6, 7, 8, 9, 10) is set as the division ratio.

FIG. 4 illustrates a correspondence relationship between the division ratio set signal DIVSET and the decoded value. The division ratio set signal DIVSET is three bits long and assumes one of five values "010", "011", "100", "101" and "110" corresponding to the respective division ratios "6", "7", "8", "9" and "10" ((010, 011, 100, 101, 110)=(6, 7, 8, 9, 10)). Accordingly, where the division ratio is set to "6", for example, so that a sixth frequency clock signal may be output as the frequency divided clock signal DIVOUT, the input division ratio set signal DIVSET is (010).

The decoder unit 21 decodes the division ratio set signal DIVSET and outputs a 3-bit decoded value. Specifically, the division ratio set signal DIVSET (010, 011, 100, 101, 110) is decoded into (011, 001, 000, 101, 111). In the 3-bit decoded value, the left bit corresponds to the polarity bit b1, the middle bit to the division ratio set bit b2, and the right bit to the division ratio set bit b3.

For example, the division ratio set signal DIVSET (010) is decoded into the value (011). In this case, the polarity bit b1 is the left bit "0" of the decoded value, the division ratio set bit b2 is the middle bit "1" of the decoded value, and the division ratio set bit b3 is the right bit "1" of the decoded value.

Figure 5:
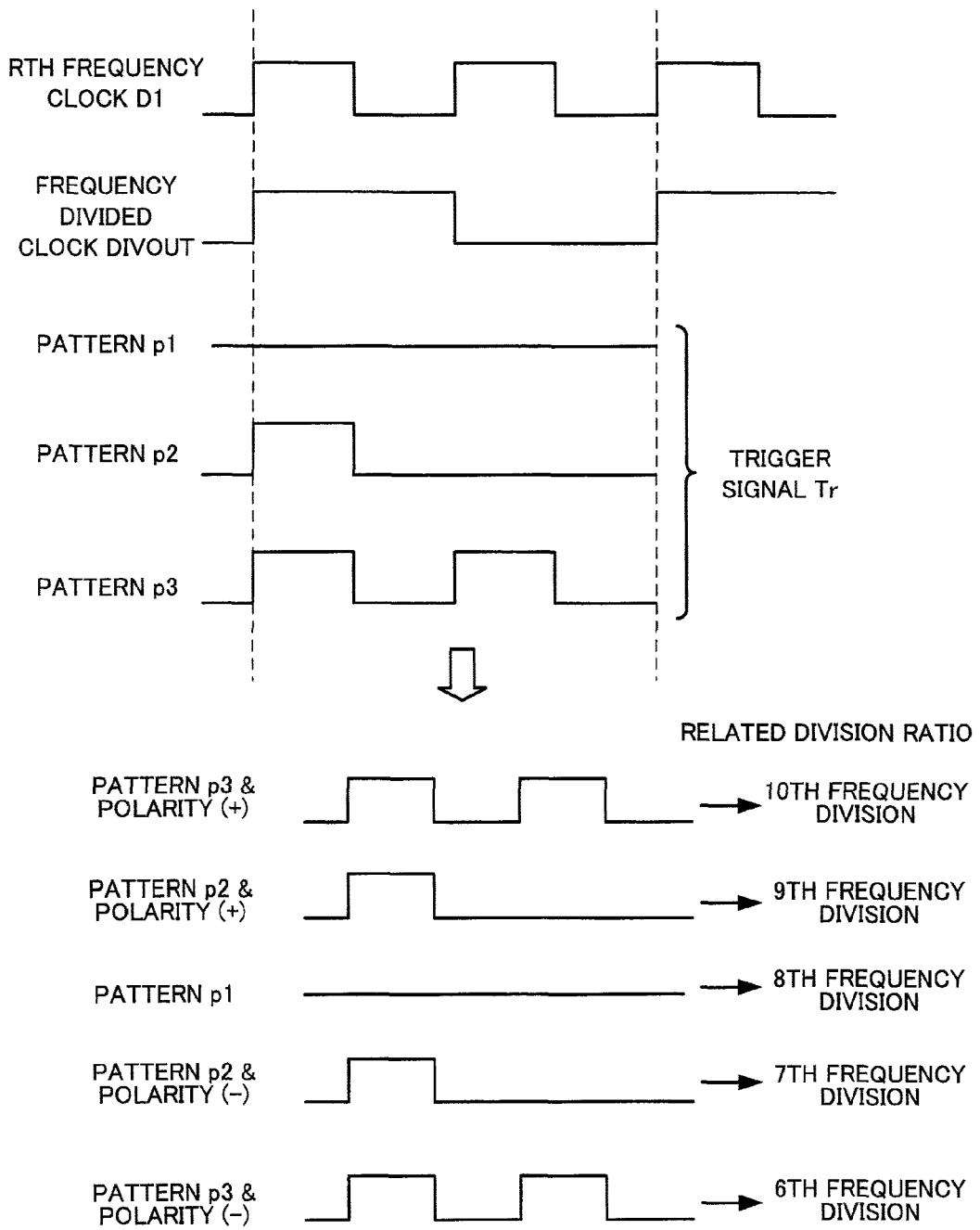
FIG. 5 illustrates division ratio setting.

The basic concept of the division ratio setting executed by the division ratio setter 20 will be now explained. FIG. 5 illustrates the division ratio setting. Since the frequency divided clock signal DIVOUT is derived by subjecting the Rth frequency clock signal D1 to ½ frequency division, one period of the frequency divided clock signal DIVOUT contains two clock pulses of the Rth frequency clock signal D1.

The Rth frequency clock signal D1 and the frequency divided clock signal DIVOUT are fed back to the division ratio setter 20, and out of the two clock pulses of the Rth frequency clock signal D1 contained in one period of the frequency divided clock signal DIVOUT, one or both or neither of the clock pulses is selected, the result being sent to the counter unit 24 as the trigger signal Tr.

Pattern p1: Where neither of the two clock pulses of the Rth frequency clock signal D1 contained in one period of the frequency divided clock signal DIVOUT is selected, the trigger signal Tr remains at the Low level as indicated by pattern p1.

Pattern p2: Where one clock pulse of the Rth frequency clock signal D1 is selected in either the High or Low interval of one period of the frequency divided clock signal DIVOUT, the trigger signal Tr has a pattern p2 (the pattern p2 in FIG. 5 indicates that the clock pulse of the Rth frequency clock signal D1 during the High interval of the frequency divided clock signal DIVOUT is selected).

Pattern p3: Where the clock pulse of the Rth frequency clock signal D1 is selected in both the High and Low intervals of one period of the frequency divided clock signal DIVOUT, the trigger signal Tr has a pattern p3.

On the other hand, the counter unit 24 is supplied with the polarity bit b1 indicative of the up/down direction, in addition to the trigger signal Tr. Thus, the combination of the above patterns p1 to p3 with the positive/negative polarity of the polarity bit b1 provides five different patterns.

The five patterns may be correlated with the division ratios "6", "7", "8", "9" and "10" as follows, for example. Where the pattern p1 as a base pattern indicates the eighth frequency division, the combination of the pattern p2 with the polarity bit "1" (polarity: (+)) may be correlated with the ninth frequency division, and the combination of the pattern p3 with the polarity bit "1" may be correlated with the tenth frequency division. Also, the combination of the pattern p2 with the polarity bit "0" (polarity: (−)) may be correlated with the seventh frequency division, and the combination of the pattern p3 with the polarity bit "0" may be correlated with the sixth frequency division.

In this manner, with respect to one period of the frequency divided clock signal DIVOUT, both of the two clock pulses of the Rth frequency clock signal D1 are blocked or only one or both of the two clock pulses of the Rth frequency clock signal D1 are selected to generate the trigger signal Tr indicating one of the three choices, and the three states or patterns of the trigger signal Tr are used in combination with the polarity logic of the polarity bit b1 to permit five different division ratios to be set.

Figure 6:
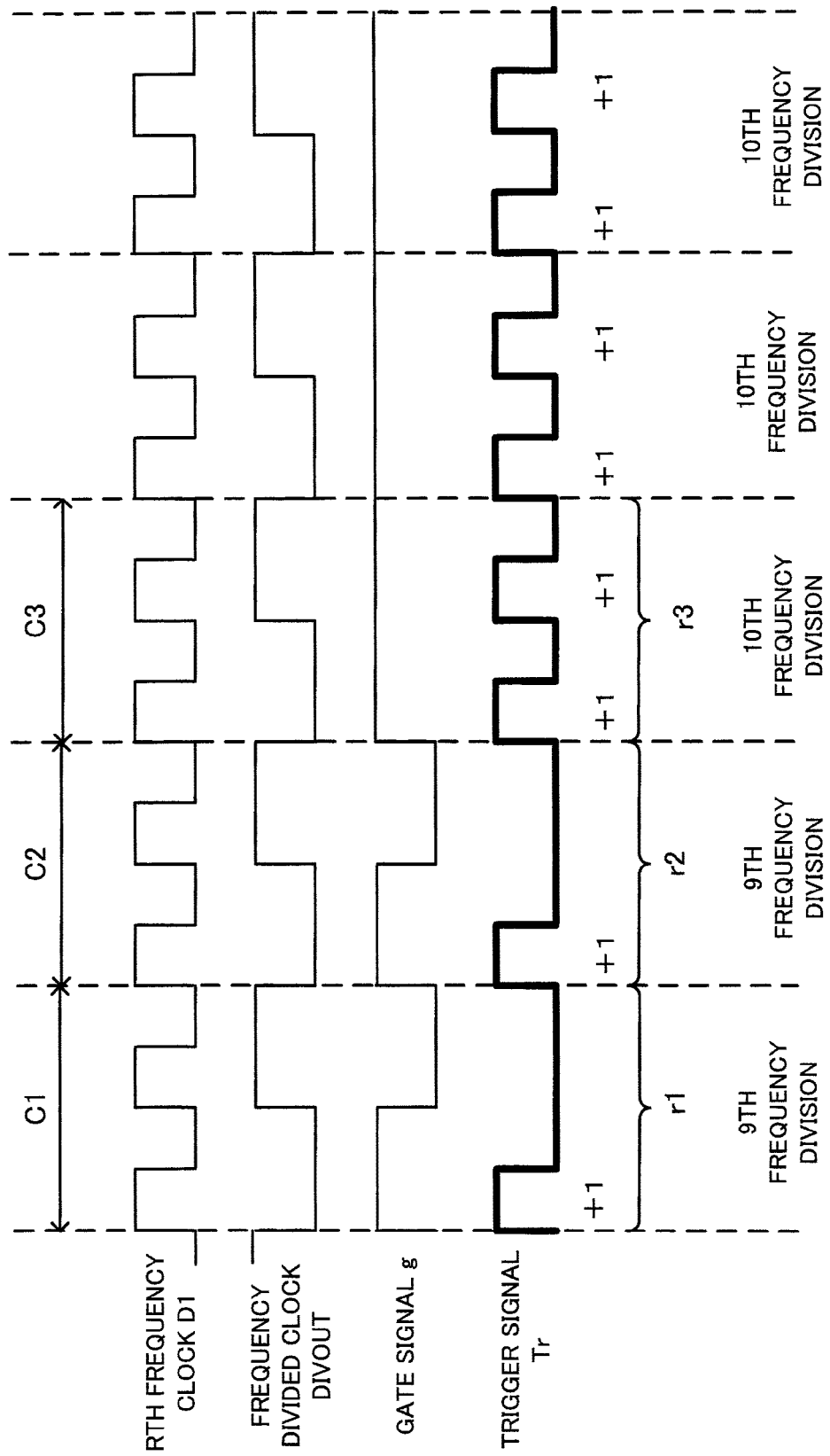
FIG. 6 illustrates a division ratio setting operation.
Figure 7:
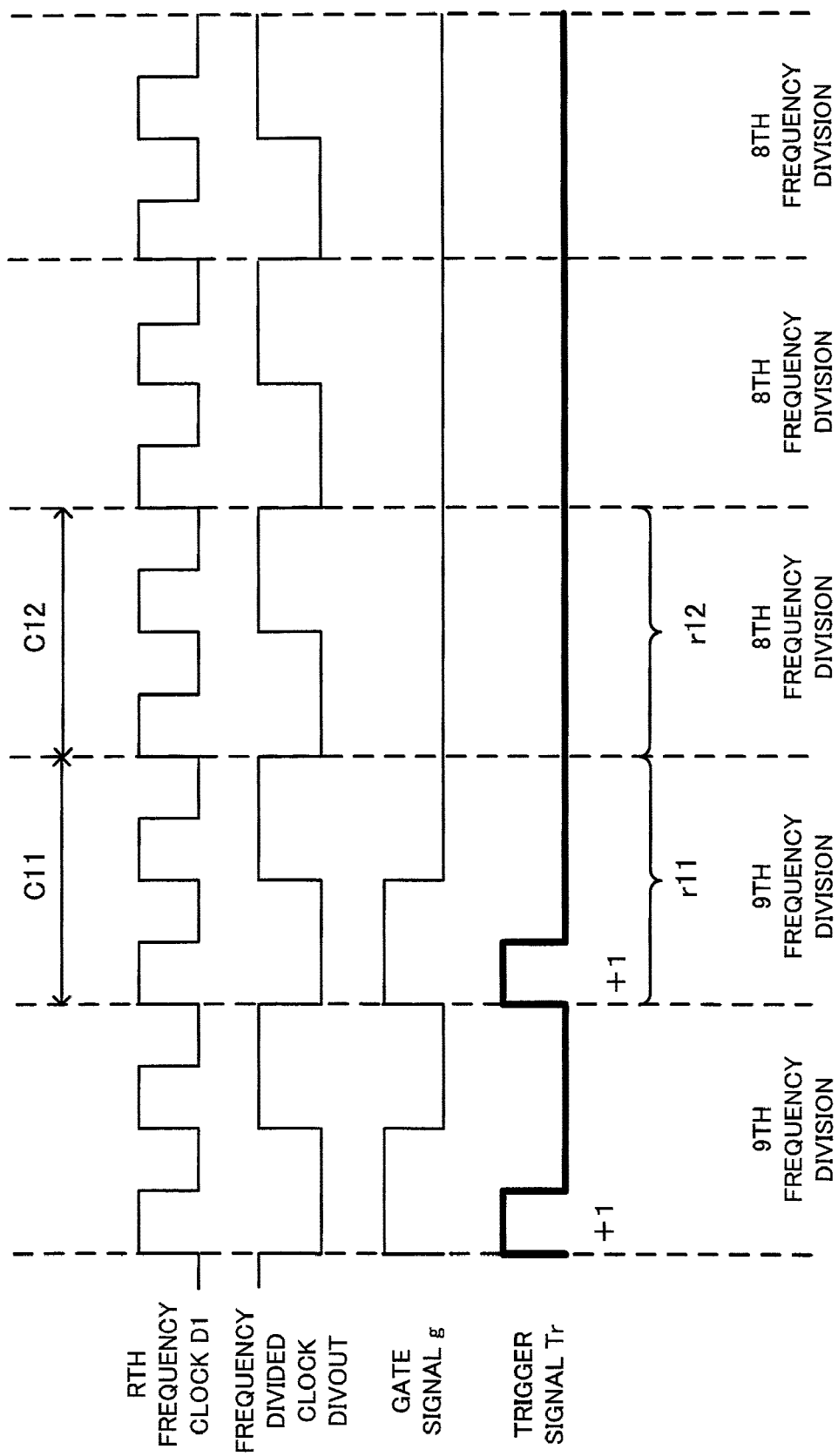
FIG. 7 illustrates another division ratio setting operation.
Figure 8:
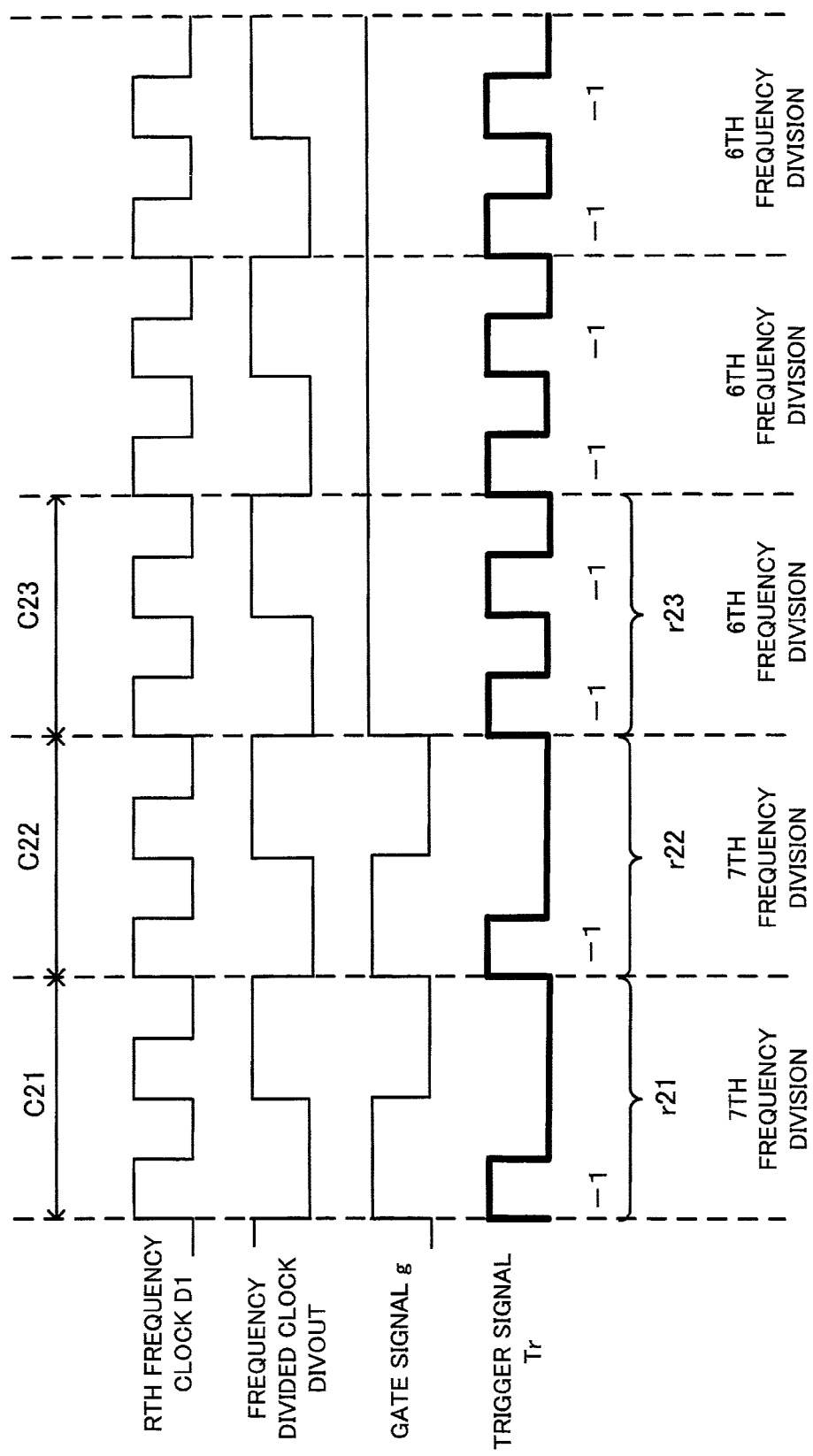
FIG. 8 illustrates still another division ratio setting operation.

Referring now to FIGS. 6 to 8, examples of how the division ratio is set by the division ratio setter 20 will be described. In FIGS. 6 to 8, the thick solid line indicates the trigger signal Tr output from the signal gate unit 23. Also, "+1" appearing under the waveform of the trigger signal Tr signifies that a phase shift is made (the phase is switched) in the positive direction, and thus is equivalent to the polarity bit b1 "1". Likewise, "−1" signifies that a phase shift is made in the negative direction, and thus is equivalent to the polarity bit b1 "0".

FIG. 6 exemplifies a division ratio setting operation, wherein the division ratio is set to implement the ninth frequency division and the tenth frequency division.

Cycle C1: The trigger signal waveform r1 during the cycle C1 represents ninth frequency division setting mode (corresponding to the "PATTERN p2 & POLARITY (+)" in FIG. 5).

Cycle C2: Also in the cycle C2, the ninth frequency division is set. In the following, the manner of setting the ninth frequency division will be explained in detail with reference also to FIGS. 2, 4 and 5. The division ratio set signal DIVSET (101) indicative of the ninth frequency division is sent to the decoder unit 21.

The decoder unit 21 decodes the division ratio set signal DIVSET (101) and generates a decoded value (101) (=(polarity bit b1, division ratio set bit b2, division ratio set bit b3)).

The polarity bit b1 "1" is sent to the counter unit 24, the division ratio set bit b2 "0" is applied to the input terminal s1 of the selector unit 22, and the division ratio set bit b3 "1" is applied to the input terminal s2 of the selector unit 22. The select terminal SEL of the selector unit 22 is input with the frequency divided clock signal DIVOUT.

The selector unit 22 selects and outputs the signal input to the input terminal s1 when the frequency divided clock signal DIVOUT is High, and selects and outputs the signal input to the input terminal s2 when the frequency divided clock signal DIVOUT is Low. Accordingly, during the Low interval of the frequency divided clock signal DIVOUT within the cycle C2, the division ratio set bit b3 applied to the input terminal s2 is selected, so that "1" is output as the gate signal g from the selector unit 22.

During the High interval of the frequency divided clock signal DIVOUT within the cycle C2, the division ratio set bit b2 applied to the input terminal s1 is selected, and therefore, "0" is output as the gate signal g from the selector unit 22.

Thus, the gate signal g turns to the High level during the Low interval of the frequency divided clock signal DIVOUT within the cycle C2, to switch on the signal gate unit 23 (allow the Rth frequency clock signal D1 to pass), so that the Rth frequency clock signal D1 passes during the High interval of the gate signal g.

Also, the gate signal g turns to the Low level during the High interval of the frequency divided clock signal DIVOUT within the cycle C2, to switch off the signal gate unit 23 (block passage of the Rth frequency clock signal D1), so that the passage of the Rth frequency clock signal D1 is blocked during the Low interval of the gate signal g.

Consequently, the signal gate unit 23 outputs the trigger signal Tr with the signal waveform pattern p2, and since the polarity bit b1=1, the signal waveform r2 during the cycle C2 represents the ninth frequency division setting mode (corresponding to the "PATTERN p2 & POLARITY (+)" in FIG. 5).

Cycle C3: In the cycle C3, the tenth frequency division is set. In the following, the manner of setting the tenth frequency division will be explained in detail with reference also to FIGS. 2, 4 and 5. The division ratio set signal DIVSET (110) indicative of the tenth frequency division is sent to the decoder unit 21.

The decoder unit 21 decodes the division ratio set signal DIVSET (110) and generates a decoded value (111) (=(polarity bit b1, division ratio set bit b2, division ratio set bit b3)).

The polarity bit b1 "1" is sent to the counter unit 24, the division ratio set bit b2 "1" is applied to the input terminal s1 of the selector unit 22, and the division ratio set bit b3 "1" is applied to the input terminal s2 of the selector unit 22. The select terminal SEL of the selector unit 22 is input with the frequency divided clock signal DIVOUT.

During the Low interval of the frequency divided clock signal DIVOUT within the cycle C3, the selector unit 22 selects the division ratio set bit b3 applied to the input terminal s2, so that "1" is output as the gate signal g. On the other hand, during the High interval of the frequency divided clock signal DIVOUT within the cycle C3, the division ratio set bit b2 applied to the input terminal s1 is selected, and therefore, "1" is output as the gate signal g.

Thus, the gate signal g turns to the High level during both the Low and High intervals of the frequency divided clock signal DIVOUT within the cycle C3, to switch on the signal gate unit 23, so that the Rth frequency clock signal D1 passes. Consequently, the signal gate unit 23 outputs the trigger signal Tr with the signal waveform pattern p3, and since the polarity bit b1=1, the signal waveform r3 during the cycle C3 represents the tenth frequency division setting mode (corresponding to the "PATTERN p3 & POLARITY (+)" in FIG. 5).

FIG. 7 exemplifies another division ratio setting operation, wherein the division ratio is set to implement the ninth frequency division and the eighth frequency division.

Cycle C11: The trigger signal waveform r11 during the cycle C11 represents the ninth frequency division setting mode (corresponding to the "PATTERN p2 & POLARITY (+)" in FIG. 5).

Cycle C12: In the cycle C12, the eighth frequency division is set. In the following, the manner of setting the eighth frequency division will be explained in detail with reference also to FIGS. 2, 4 and 5. The division ratio set signal DIVSET (100) indicative of the eighth frequency division is sent to the decoder unit 21.

The decoder unit 21 decodes the division ratio set signal DIVSET (100) and generates a decoded value (000) (=(polarity bit b1, division ratio set bit b2, division ratio set bit b3)).

The polarity bit b1 "0" is sent to the counter unit 24, the division ratio set bit b2 "0" is applied to the input terminal s1 of the selector unit 22, and the division ratio set bit b3 "0" is applied to the input terminal s2 of the selector unit 22. The select terminal SEL of the selector unit 22 is input with the frequency divided clock signal DIVOUT.

During the Low interval of the frequency divided clock signal DIVOUT within the cycle C12, the selector unit 22 selects the division ratio set bit b3 applied to the input terminal s2, so that "0" is output as the gate signal g. On the other hand, during the High interval of the frequency divided clock signal DIVOUT within the cycle C12, the division ratio set bit b2 applied to the input terminal s1 is selected, and therefore, "0" is output as the gate signal g.

Thus, the gate signal g turns to the Low level during both the Low and High intervals of the frequency divided clock signal DIVOUT within the cycle C12, to switch off the signal gate unit 23, so that the passage of the Rth frequency clock signal D1 is blocked.

Consequently, the signal gate unit 23 outputs the trigger signal Tr with the signal waveform pattern p1, and the signal waveform r12 during the cycle C12 represents the eighth frequency division setting mode (corresponding to the "PATTERN p1" in FIG. 5). In the case of setting the eighth frequency division, the value of the polarity bit b1 is treated as meaningless ("don't care") (the polarity bit b1 may be either "0" or "1").

FIG. 8 exemplifies still another division ratio setting operation, wherein the division ratio is set to implement the seventh frequency division and the sixth frequency division.

Cycle C21: The trigger signal waveform r21 during the cycle C21 represents seventh frequency division setting mode (corresponding to the "PATTERN p2 & POLARITY (−)" in FIG. 5).

Cycle C22: Also in the cycle C22, the seventh frequency division is set. In the following, the manner of setting the seventh frequency division will be explained in detail with reference also to FIGS. 2, 4 and 5. The division ratio set signal DIVSET (011) indicative of the seventh frequency division is sent to the decoder unit 21.

The decoder unit 21 decodes the division ratio set signal DIVSET (011) and generates a decoded value (001) (=(polarity bit b1, division ratio set bit b2, division ratio set bit b3)).

The polarity bit b1 "0" is sent to the counter unit 24, the division ratio set bit b2 "0" is applied to the input terminal s1 of the selector unit 22, and the division ratio set bit b3 "1" is applied to the input terminal s2 of the selector unit 22. The select terminal SEL of the selector unit 22 is input with the frequency divided clock signal DIVOUT.

During the Low interval of the frequency divided clock signal DIVOUT within the cycle C22, the selector unit 22 selects the division ratio set bit b3 applied to the input terminal s2, so that "1" is output as the gate signal g. On the other hand, during the High interval of the frequency divided clock signal DIVOUT within the cycle C22, the division ratio set bit b2 applied to the input terminal s1 is selected, and therefore, "0" is output as the gate signal g.

Thus, the gate signal g turns to the High level during the Low interval of the frequency divided clock signal DIVOUT within the cycle C22, to switch on the signal gate unit 23, so that the Rth frequency clock signal D1 passes during the High interval of the gate signal g. Also, the gate signal g turns to the Low level during the High interval of the frequency divided clock signal DIVOUT within the cycle C22, to switch off the signal gate unit 23, so that the passage of the Rth frequency clock signal D1 is blocked during the Low interval of the gate signal g.

Consequently, the signal gate unit 23 outputs the trigger signal Tr with the signal waveform pattern p2, and since the polarity bit b1=0, the signal waveform r22 during the cycle C22 represents the seventh frequency division setting mode (corresponding to the "PATTERN p2 & POLARITY (−)" in FIG. 5).

Cycle C23: In the cycle C23, the sixth frequency division is set. In the following, the manner of setting the sixth frequency division will be explained in detail with reference also to FIGS. 2, 4 and 5. The division ratio set signal DIVSET (010) indicative of the sixth frequency division is sent to the decoder unit 21.

The decoder unit 21 decodes the division ratio set signal DIVSET (010) and generates a decoded value (011) (=(polarity bit b1, division ratio set bit b2, division ratio set bit b3)).

The polarity bit b1 "0" is sent to the counter unit 24, the division ratio set bit b2 "1" is applied to the input terminal s1 of the selector unit 22, and the division ratio set bit b3 "1" is applied to the input terminal s2 of the selector unit 22. The select terminal SEL of the selector unit 22 is input with the frequency divided clock signal DIVOUT.

During the Low interval of the frequency divided clock signal DIVOUT within the cycle C23, the selector unit 22 selects the division ratio set bit b3 applied to the input terminal s2, so that "1" is output as the gate signal g. On the other hand, during the High interval of the frequency divided clock signal DIVOUT within the cycle C23, the division ratio set bit b2 applied to the input terminal s1 is selected, and therefore, "1" is output as the gate signal g.

Thus, the gate signal g turns to the High level during both the Low and High intervals of the frequency divided clock signal DIVOUT within the cycle C23, to switch on the signal gate unit 23, so that the Rth frequency clock signal D1 passes. Consequently, the signal gate unit 23 outputs the trigger signal Tr with the signal waveform pattern p3, and since the polarity bit b1=0, the signal waveform r23 during the cycle C23 represents the sixth frequency division setting mode (corresponding to the "PATTERN p3 & POLARITY (−)" in FIG. 5).

Figure 9:
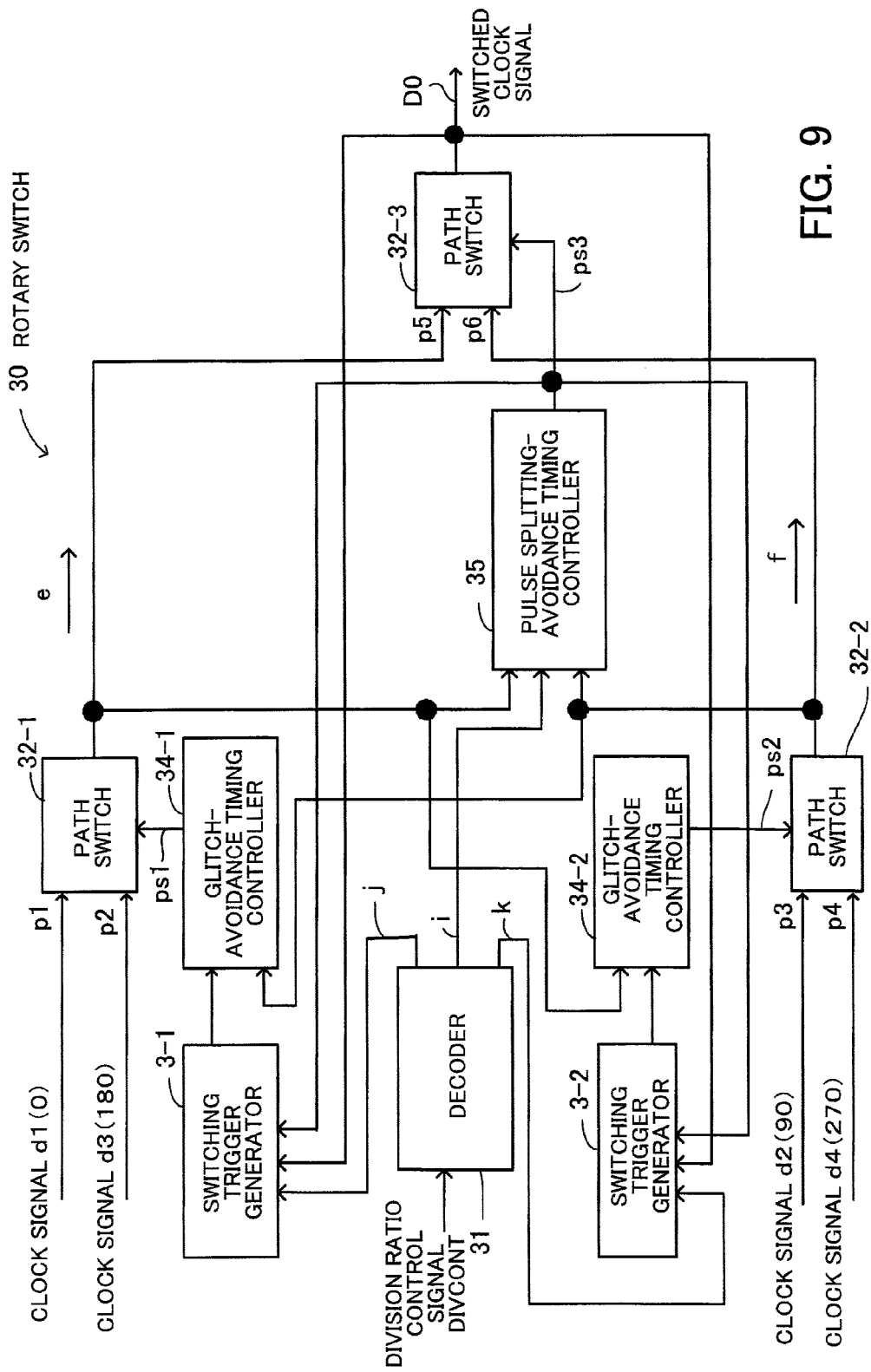
FIG. 9 illustrates the configuration of a rotary switch.

The rotary switch 30 will be now described. FIG. 9 illustrates the configuration of the rotary switch 30. The rotary switch 30 comprises a decoder 31, path switches 32-1, 32-2 and 32-3, switching trigger generators 3-1 and 3-2, glitch-avoidance timing controllers 34-1 and 34-2, and a pulse splitting-avoidance timing controller 35.

The path switches 32-1, 32-2 and 32-3 correspond respectively to first, second and third path switches. Also, the switching trigger generators 3-1 and 3-2 correspond respectively to first and second switching trigger generators. Further, the glitch-avoidance timing controllers 34-1 and 34-2 correspond respectively to first and second glitch-avoidance timing controllers.

Basic operation of the rotary switch 30 is accomplished by the decoder 31 and the path switches 32-1, 32-2 and 32-3, and the other elements are provided to avoid pulse splitting and glitches.

The path switch 32-1 receives the clock signals d1 (0) and d3 (180) output from the phase shifter 13, selects one of the clock signals in accordance with a path switching signal ps1, and outputs the selected clock signal as a signal e (first clock signal) (the path switching referred to herein means switching the clock signal from one to another).

The path switch 32-2 receives the clock signals d2 (90) and d4 (270) output from the phase shifter 13, then selects one of the clock signals in accordance with a path switching signal ps2, and outputs the selected clock signal as a signal f (second clock signal).

The path switch 32-3 receives the signals e and f output from the respective path switches 32-1 and 32-2, then selects one of the signals in accordance with a path switching signal ps3, and outputs the selected signal as the switched clock signal D0.

The decoder 31 receives the division ratio control signal DIVCONT output from the division ratio setter 20 and decodes the received signal into signals i, j and k. The signal j is the origin of the path switching signal ps1 for changing the path set in the path switch 32-1. The signal k is the origin of the path switching signal ps2 for changing the path set in the path switch 32-2, and the signal i is the origin of the path switching signal ps3 for changing the path set in the path switch 32-3.

Figure 10:
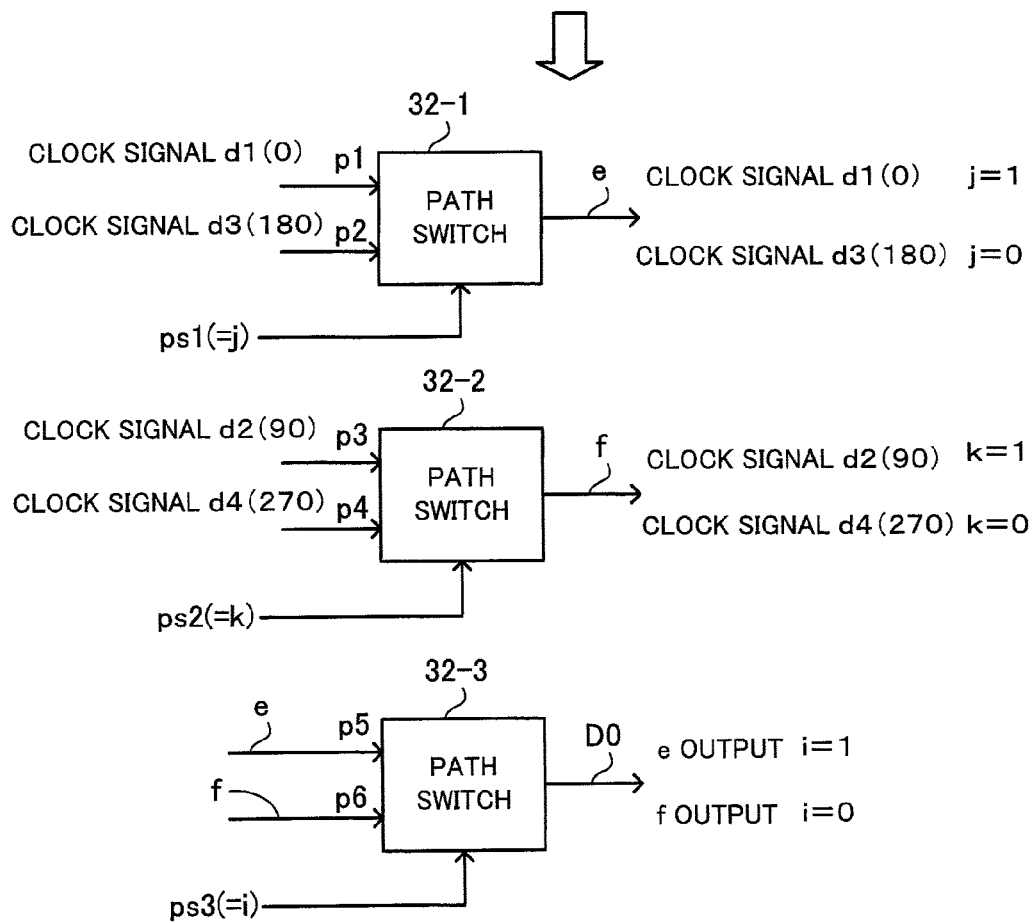
FIG. 10 illustrates the correspondence relationship between decoded values and path switching.

Circuit operation relating to the path switching will be explained. FIG. 10 illustrates a correspondence relationship between the decoded value and the path switching. In the table illustrated in FIG. 10, the values of the signals i, j and k represent values that the respective signals assume in the case where the rotary switch 30 switches the phase in the direction 0°→90°→180°→270°, and the values in parentheses represent values that the respective signals i, j and k assume in the case where the rotary switch 30 switches the phase in the direction 0°→270°→180°→90°.

The values (00, 01, 11, 10) of the division ratio control signal DIVCONT correspond respectively to (0°, 90°, 180°, 270°). The decoder 31 outputs the signals i, j and k as the decoded value. Where the rotary switch rotates in the direction 0→90→180→270°→0° . . . , the values (1, 1, 1) are output as the signals (i, j, k) in response to the input of the signal "00", the values (0, 0, 1) are output as the signals (i, j, k) in response to the input of the signal "01", the values (1, 0, 0) are output as the signals (i, j, k) in response to the input of the signal "11", and the values (0, 1, 0) are output as the signals (i, j, k) in response to the input of the signal "10". On the other hand, where the rotary switch rotates in the reverse direction 0→270°→180°→90°→0° . . . , the values (1, 1, 0) are output as the signals (i, j, k) in response to the input of the signal "00", the values (0, 0, 0) are output as the signals (i, j, k) in response to the input of the signal "10", the values (1, 0, 1) are output as the signals (i, j, k) in response to the input of the signal "11", and the values (0, 1, 1) are output as the signals (i, j, k) in response to the input of the signal "01".

When the path switching signal ps1 is "1", the path switch 32-1 outputs the signal applied to its terminal p1 as the signal e, and when the path switching signal ps1 is "0", the path switch 32-1 outputs the signal applied to its terminal p2 as the signal e. Since the path switching signal ps1 is equivalent to the signal j, the clock signal d1 (0) is selected when j=1, and the clock signal d3 (180) is selected when j=0.

When the path switching signal ps2 is "1", the path switch 32-2 outputs the signal applied to its terminal p3 as the signal f, and when the path switching signal ps2 is "0", the path switch 32-2 outputs the signal applied to its terminal p4 as the signal f. Since the path switching signal ps2 is equivalent to the signal k, the clock signal d2 (90) is selected when k=1, and the clock signal d4 (270) is selected when k=0.

When the path switching signal ps3 is "1", the path switch 32-3 outputs the signal e applied to its terminal p5 as the switched clock signal D0, and when the path switching signal ps3 is "0", the path switch 32-3 outputs the signal f applied to its terminal p6 as the switched clock signal D0. Since the path switching signal ps3 is equivalent to the signal i, the signal e is selected when i=1, and the signal f is selected when i=0. Thus, when the 0°- or 180°-phase signal is being output, the k value also is determined to be "0" or "1" depending on the rotating direction of the rotary switch, and when the 90°- or 270°-phase signal is being output, the j value also is determined to be "0" or "1" depending on the rotating direction. This is done because the switchover to the clock signal with the phase to be output next needs to be completed in the path switch 32-1 or 32-2 before the path switch 32-3 switches the phase next between e and f.

The circuit section for restraining the pulse splitting and glitches will be now explained. In order to prevent the pulse splitting from occurring in the switched clock signal D0, the pulse splitting-avoidance timing controller 35 outputs the input signal i as the path switching signal ps3 only when the signals e and f are of the same potential (both High or both Low).

It is therefore necessary that the pulse splitting-avoidance timing controller 35 be input with the signals e and f, besides the signal i. Where the signals e and f are input to the pulse splitting-avoidance timing controller 35, however, glitch may possibly occur in the pulse splitting-avoidance timing controller 35 depending on the path switching timing of the path switches 32-1 and 32-3.

Specifically, if the output signals e and f that were switched at nearly the same timing in the respective path switches 32-1 and 32-2 are input to the pulse splitting-avoidance timing controller 35, glitch possibly occurs.

Accordingly, the signals e and f need to be controlled so as not to simultaneously change from High to Low or from Low to High, thereby preventing the occurrence of glitch and malfunction of the pulse splitting-avoidance timing controller 35.

To prevent the occurrence of glitch, the transition to High or Low of one of the input signals e and f to the pulse splitting-avoidance timing controller has only to be completed when the other signal is switched (32-1, 32-2). Specifically, during the time in which the transition of the signal f from Low to High or from High to Low does not take place, switchover from the clock signal d1 (0) to the clock signal d3 (180) or vice versa has to be performed in the path switch 32-1.

Also, during the time in which the transition of the signal e from Low to High or from High to Low does not take place, switchover from the clock signal d2 (90) to the clock signal d4 (270) or vice versa has to be performed in the path switch 32-2.

In order to cause the path switch 32-1 to perform path switching after the path switching of the path switch 32-2 is completed, the switching trigger generator 3-1 determines based on the logical level of the path switching signal ps3 whether or not the signal f is currently selected, and during the time in which the logical level of the path switching signal ps3 indicates the selection of the signal f, the switching trigger generator 3-1 holds the decoded value of the signal j with the use of the switched clock signal D0.

Also, to cause the path switch 32-2 to perform path switching after the path switching of the path switch 32-1 is completed, the switching trigger generator 3-2 determines based on the logical level of the path switching signal ps3 whether or not the signal e is currently selected, and during the time in which the logical level of the path switching signal ps3 indicates the selection of the signal e, the switching trigger generator 3-2 holds the decoded value of the signal k with the use of the switched clock signal D0.

The aforementioned control of the switching trigger generators 3-1 and 3-2 makes it possible to keep a suitable one of the path switches 32-1 and 32-2 from executing the path switching.

On the other hand, the glitch-avoidance timing controller 34-1 holds the output signal j of the switching trigger generator 3-1 with the use of the signal f so that the signal j may be sent to the path switch 32-1 as the path switching signal ps1 after the transition of the output signal f of the path switch 32-2 from Low to High or from High to Low is completed.

Also, the glitch-avoidance timing controller 34-2 holds the output signal k of the switching trigger generator 3-2 with the use of the signal e so that the signal k may be sent to the path switch 32-2 as the path switching signal ps2 after the transition of the output signal e of the path switch 32-1 from Low to High or from High to Low is completed.

In this manner, the switching trigger generators 3-1 and 3-2 keep one of the path switches 32-1 and 32-2 from executing the path switching, and moreover, the glitch-avoidance timing controllers 34-1 and 34-2 ensure that one of the path switching signals ps1 and ps2 is output after the transition of the other signal from Low to High or from High to Low is completed, whereby glitch is prevented from occurring in the pulse splitting-avoidance timing controller 35. Consequently, the rotary switch 30 performs the phase switching only at such timing that no pulse splitting is caused, and thus anomalous operation attributable to glitch does not occur.

Figure 11:
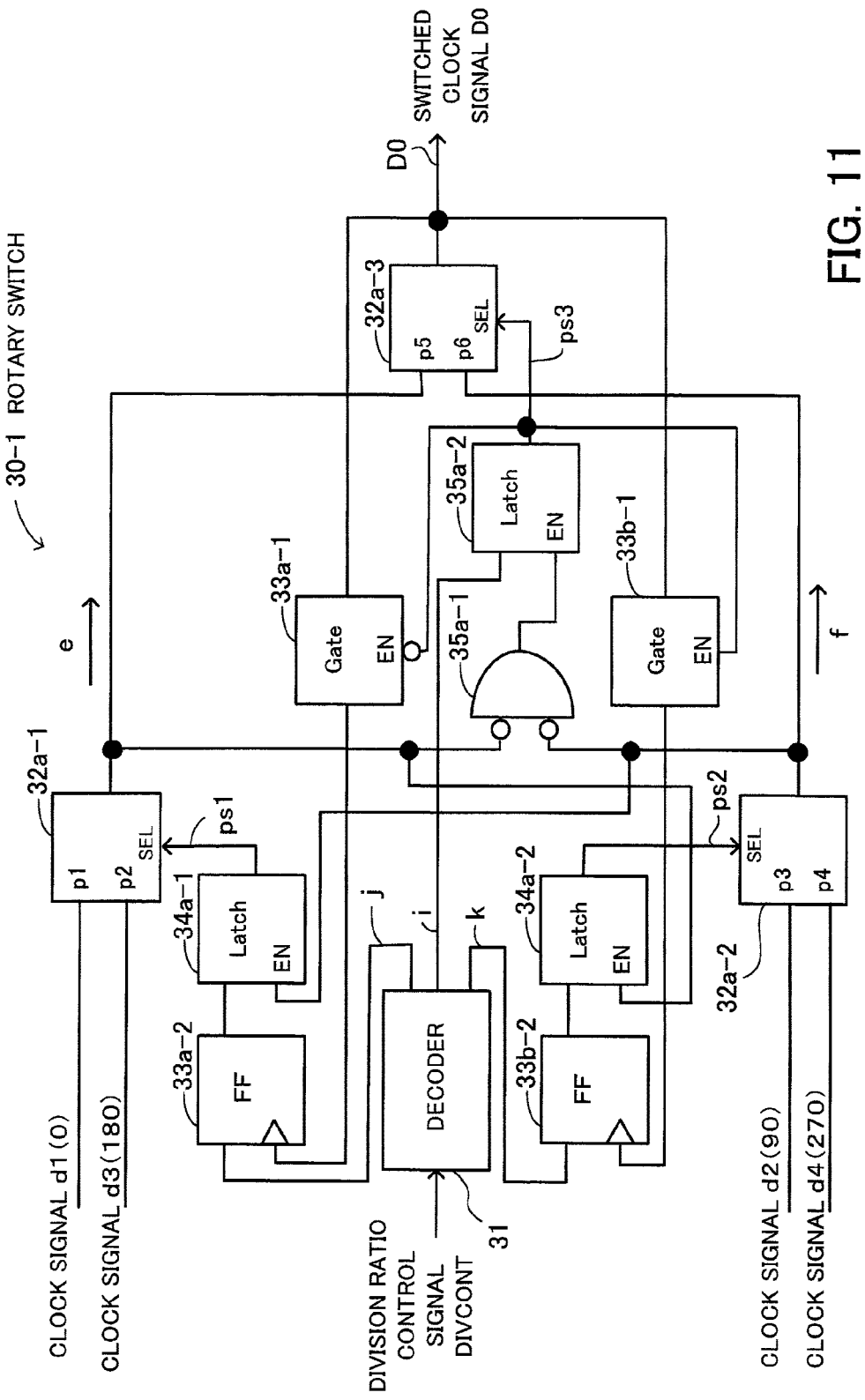
FIG. 11 is a detailed circuit block diagram of the rotary switch.

FIG. 11 is a detailed circuit block diagram of the rotary switch 30. A rotary switch 30-1 comprises the decoder 31, 2:1 selectors 32a-1, 32a-2 and 32a-3, gates 33a-1 and 33b-1, flip-flops (FF) 33a-2 and 33b-2, latches 34a-1, 34a-2 and 35a-2, and a NAND gate 35a-1.

The 2:1 selectors 32a-1, 32a-2 and 32a-3 correspond respectively to the path switches 32-1, 32-2 and 32-3. The gate 33a-1 and the flip-flop 33a-2 function as the switching trigger generator 3-1, and the gate 33b-1 and the flip-flop 33b-2 function as the switching trigger generator 3-2.

Also, the latches 34a-1 and 34a-2 correspond respectively to the glitch-avoidance timing controllers 34-1 and 34-2. The NAND gate 35a-1 and the latch 35a-2 function as the pulse splitting-avoidance timing controller 35.

The decoder 31 decodes the division ratio control signal DIVCONT and outputs the signals i, j and k. The signal j is input to the flip-flop 33a-2, the signal k is input to the flip-flop 33b-2, and the signal i is input to the latch 35a-2.

In the 2:1 selector 32a-1, the terminal p1 is input with the clock signal d1 (0), the terminal p2 is input with the clock signal d3 (180), and the select terminal SEL is input with the path switching signal ps1 output from the latch 34a-1.

In the 2:1 selector 32a-2, the terminal p3 is input with the clock signal d2 (90), the terminal p4 is input with the clock signal d4 (270), and the select terminal SEL is input with the path switching signal ps2 output from the latch 34a-2.

In the 2:1 selector 32a-3, the terminal p5 is input with the signal e output from the 2:1 selector 32a-1, the terminal p6 is input with the signal f output from the 2:1 selector 32a-2, and the select terminal SEL is input with the path switching signal ps3 output from the latch 35a-2.

The switched clock signal D0 output from the 2:1 selector 32a-3 is input to the gates 33a-1 and 33b-1, of which the enable terminals are input with the path switching signal ps3. The gate 33a-1 is a negatively enabled type while the gate 33b-1 is a positively enabled type so that the gates may be selected in a mutually exclusive manner.

Specifically, when the gate 33a-1 is enabled by the path switching signal ps3 to allow the switched clock signal D0 to pass therethrough, the gate 33b-1 is closed and blocks the passage of the switched clock signal D0. On the other hand, when the gate 33b-1 is enabled by the path switching signal ps3 to allow the switched clock signal D0 to pass therethrough, the gate 33a-1 is closed, blocking the passage of the switched clock signal D0.

The switched clock signal D0 output from the gate 33a-1 is input to the clock terminal of the flip-flop 33a-2. The latch 34a-1 is input with the signal j output from the flip-flop 33a-2 and is also input at its enable terminal with the signal f.

The switched clock signal D0 output from the gate 33b-1 is input to the clock terminal of the flip-flop 33b-2. The latch 34a-2 is input with the signal k output from the flip-flop 33b-2 and is also input at its enable terminal with the signal e. The signals e and f are also input to the respective two input terminals of the NAND gate 35a-1, whose output signal is applied to the enable terminal of the latch 35a-2.

The following describes, with reference to FIGS. 1 and 12 through 16, the manner of how the frequency divided clock signal DIVOUT is generated by dividing the frequency of the input clock signal ck in one of the division ratios (6, 7, 8, 9, 10) as an exemplary set of division ratios (wherein P=4, Q=4, R=1) (the concept of "period" referred to hereinafter is used with the intention of making the explanation easier to understand and is not rigorously related with actual circuit operation).

Figure 12:
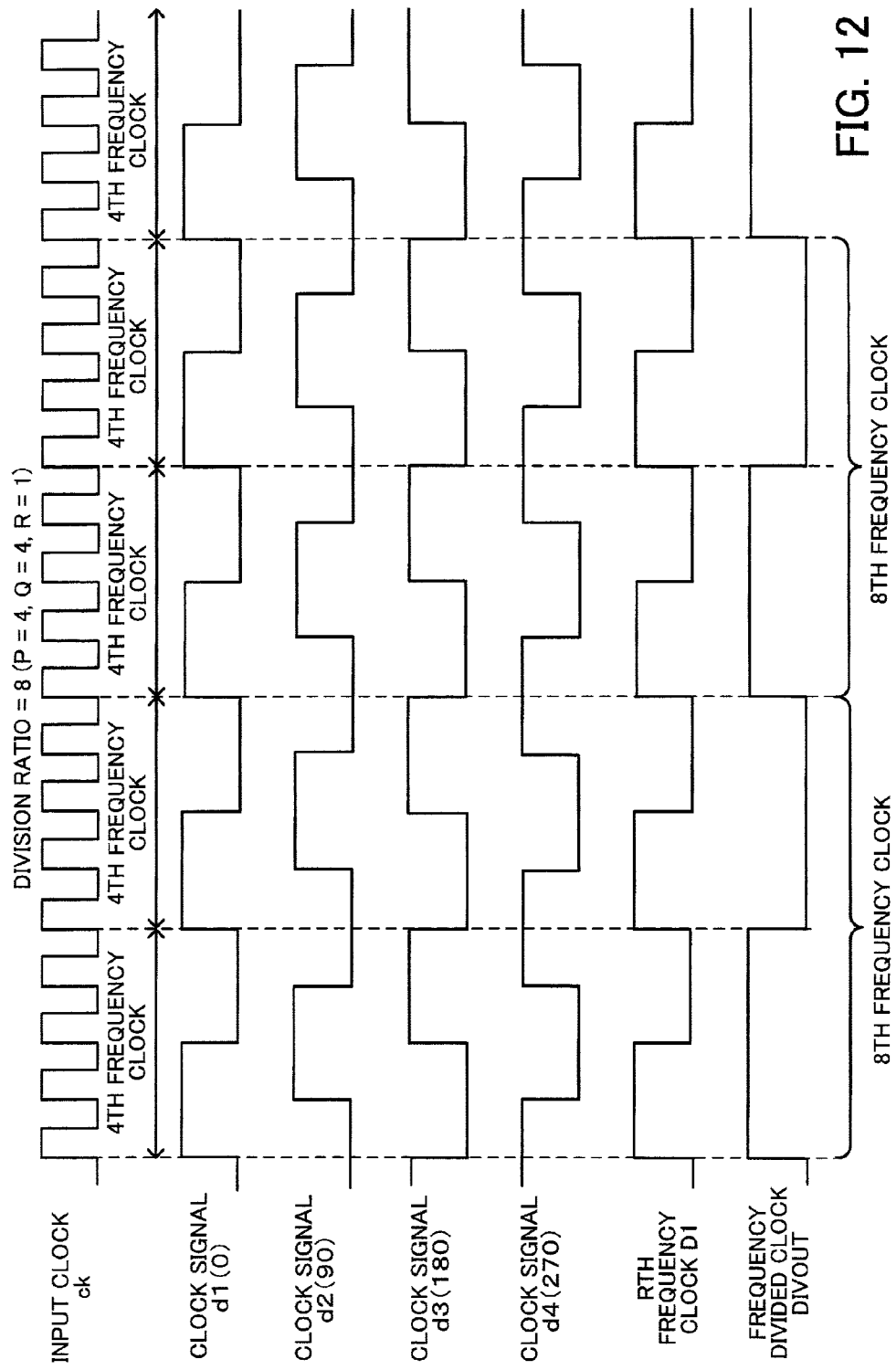
FIG. 12 is a timing chart illustrating a process of generating a frequency divided clock signal with a division ratio of "8"

FIG. 12 is a timing chart illustrating the process of generating the frequency divided clock signal DIVOUT with the division ratio "8". The input clock signal ck is subjected to ¼ frequency division at the 1/P frequency divider 12, and the fourth frequency clock signal is output from the 1/P frequency divider 12. The phase shifter 13 shifts the phase of the fourth frequency clock signal to 0°, 90°, 180° and 270°, and outputs clock signals d1 to d4 shifted in phase by 90°.

Where the division ratio=8, the rotary switch 30 does not perform the phase switching and outputs one of the clock signals d1 to d4 as the switched clock signal D0. In this instance, the clock signal d1 (0) is output.

The 1/R frequency divider 14 passes the input signal therethrough because R=1, so that the clock signal d1 (0) is output as the Rth frequency clock signal D1. The ½ frequency divider 15 subjects the clock signal d1 (0) to ½ frequency division. Consequently, an eighth frequency clock signal obtained by subjecting the input clock signal ck to ⅛ frequency division is output as the frequency divided clock signal DIVOUT.

Figure 13:
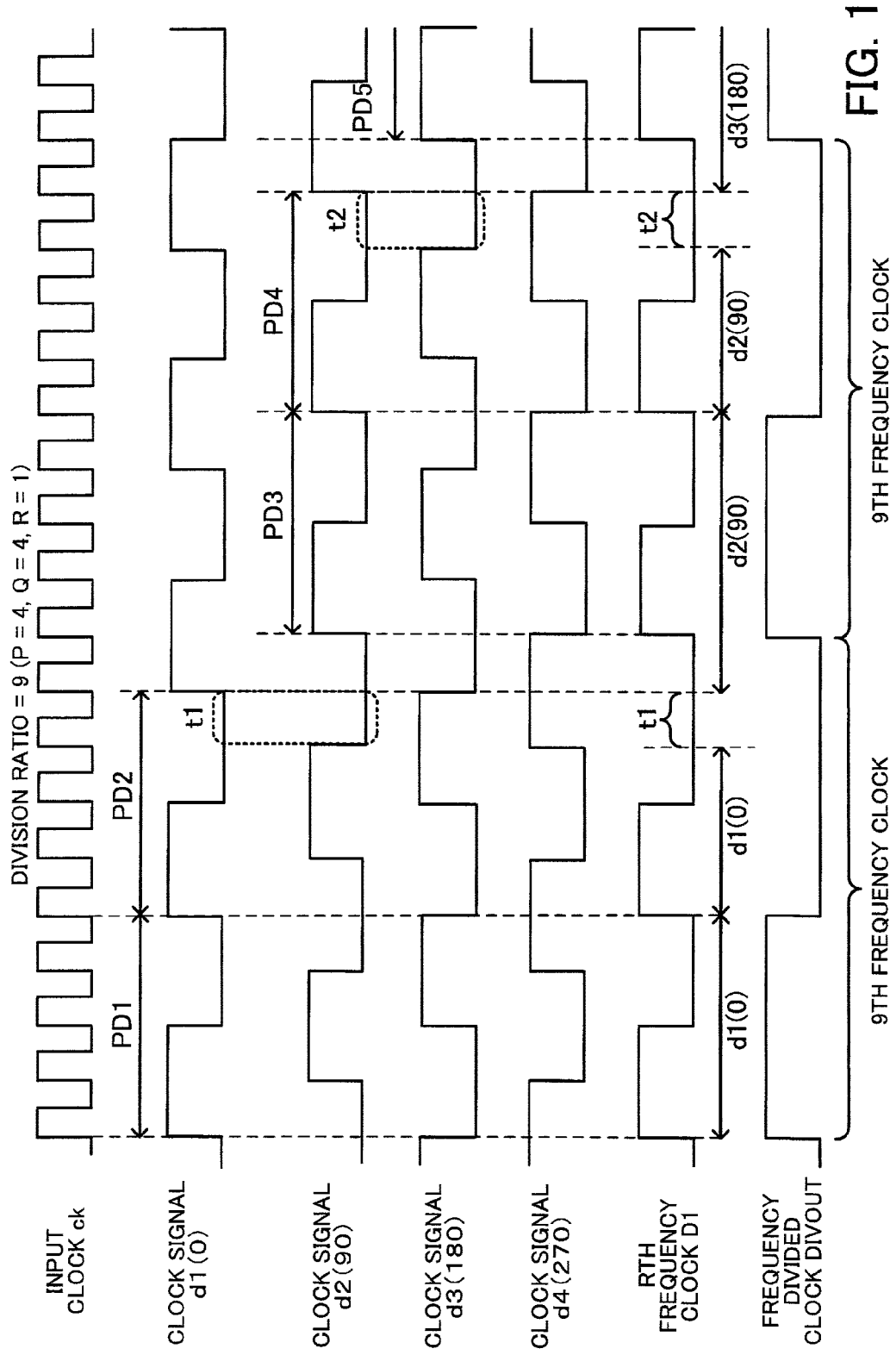
FIG. 13 is a timing chart illustrating a process of generating a frequency divided clock signal with a division ratio of "9"

FIG. 13 is a timing chart illustrating the process of generating the frequency divided clock signal DIVOUT with the division ratio "9". Where the division ratio=9, the rotary switch 30 switches the phase in the positive direction once in every two clock periods of the clock signals d1 to d4. For example, among periods PD1 to PD4 illustrated in FIG. 13, no phase switching is effected in the periods PD1 and PD3, and the phase switching is effected in the periods PD2 and PD4.

Period PD1: No phase switching is executed in this period. The clock signal d1 (0) is output from the rotary switch 30 as the switched clock signal D0. During the period PD1, therefore, the Rth frequency clock signal D1 is identical with the clock signal d1 (0).

Period PD2: In this period, the phase switching is performed. During the phase switching time interval t1 in which the clock signals d1 (0) and d2 (90) are both Low, the rotary switch 30 executes phase switching from the clock signal d1 (0) to the clock signal d2 (90).

From the start timing of the period PD2 through to the start timing of the phase switching time interval t1, the clock signal d1 (0) is output as the switched clock signal D0, and therefore, during this time, the Rth frequency clock signal D1 is identical with the clock signal d1 (0). During the phase switching time interval t1, the Rth frequency clock signal D1 remains at the Low level.

Since the phase has been switched from the clock signal d1 (0) to the clock signal d2 (90), the phase switching control is performed next on the basis of the period of the clock signal d2 (90). From the end timing of the phase switching time interval t1 through to the start timing of the period PD3 of the clock signal d2 (90), the Low level of the switched clock signal d2 (90) is output as the Rth frequency clock signal D1.

Period PD3: No phase switching is executed in this period. The clock signal d2 (90) is output, and therefore, during the period PD3, the Rth frequency clock signal D1 is identical with the clock signal d2 (90).

Period PD4: In this period, the phase switching is executed. During the phase switching time interval t2 in which the clock signals d2 (90) and d3 (180) are both Low, the rotary switch 30 switches the phase from the clock signal d2 (90) to the clock signal d3 (180).

From the start timing of the period PD4 through to the start timing of the phase switching time interval t2, the clock signal d2 (90) is output as the switched clock signal D0, and therefore, during this time, the Rth frequency clock signal D1 is identical with the clock signal d2 (90). During the phase switching time interval t2, the Rth frequency clock signal D1 remains at the Low level.

Since the phase has been switched from the clock signal d2 (90) to the clock signal d3 (180), the phase switching control is performed next on the basis of the period of the clock signal d3 (180). From the end timing of the phase switching time interval t2 through to the start timing of the period PD5 of the clock signal d3 (180), the Low level of the switched clock signal d3 (180) is output as the Rth frequency clock signal D1. The phase switching is repeated thereafter in like manner.

Because of the phase switching executed as described above, the Rth frequency clock signal D1 is derived as the combination of the fourth and fifth frequency clock signals (in the Rth frequency clock signal D1 depicted in FIG. 13, for example, provided the leftmost clock period and the succeeding clock period are first and second clock periods, respectively, the first clock period is equivalent to the fourth frequency clock signal while the second clock period is equivalent to the fifth frequency clock signal). The Rth frequency clock signal D1 is input to the ½ frequency divider 15 to be subjected to ½ frequency division, and accordingly, a ninth frequency clock signal derived by subjecting the input clock signal ck to ⅑ frequency division is output as the frequency divided clock signal DIVOUT.

Figure 14:
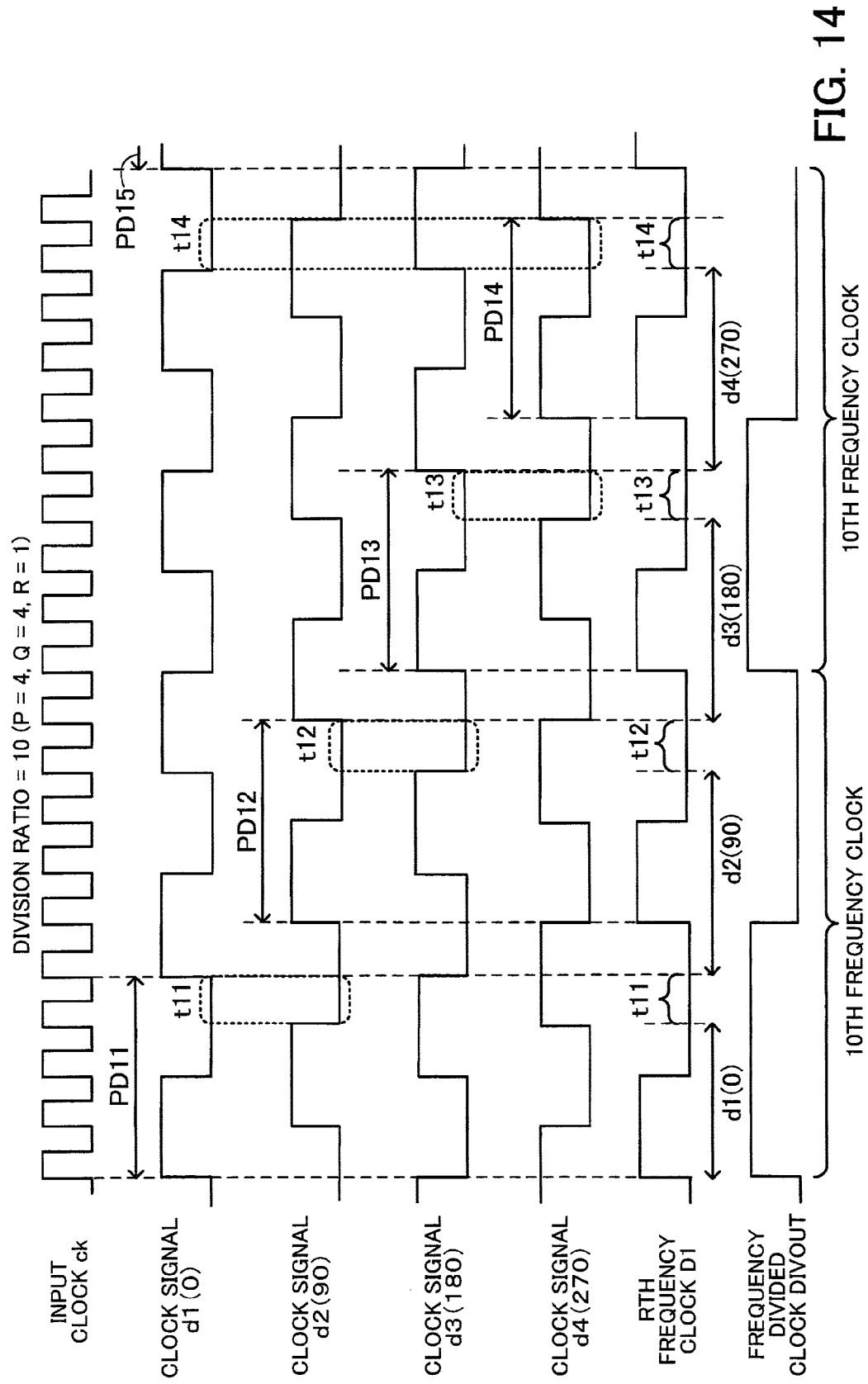
FIG. 14 is a timing chart illustrating a process of generating a frequency divided clock signal with a division ratio of "10"

FIG. 14 is a timing chart illustrating the process of generating the frequency divided clock signal DIVOUT with the division ratio "10". Where the division ratio=10, the rotary switch 30 switches the phase in the positive direction in every clock period of the clock signals d1 to d4. Namely, the phase switching is effected in each of periods PD11 to PD14 illustrated in FIG. 14.

Period PD11: During the phase switching time interval t11 in which the clock signals d1 (0) and d2 (90) are both Low, the rotary switch 30 executes phase switching from the clock signal d1 (0) to the clock signal d2 (90).

From the start timing of the period PD11 through to the start timing of the phase switching time interval t11, the clock signal d1 (0) is output as the switched clock signal D0, and therefore, during this time, the Rth frequency clock signal D1 is identical with the clock signal d1 (0). During the phase switching time interval t11, the Rth frequency clock signal D1 remains at the Low level.

Since the phase has been switched from the clock signal d1 (0) to the clock signal d2 (90), the phase switching control is performed next on the basis of the period of the clock signal d2 (90). From the end timing of the phase switching time interval t11 through to the start timing of the period PD12 of the clock signal d2 (90), the Low level of the switched clock signal d2 (90) is output as the Rth frequency clock signal D1.

Period PD12: During the phase switching time interval t12 in which the clock signals d2 (90) and d3 (180) are both Low, the rotary switch 30 switches the phase from the clock signal d2 (90) to the clock signal d3 (180).

From the start timing of the period PD12 through to the start timing of the phase switching time interval t12, the clock signal d2 (90) is output as the switched clock signal D0, and therefore, during this time, the Rth frequency clock signal D1 is identical with the clock signal d2 (90). During the phase switching time interval t12, the Rth frequency clock signal D1 remains at the Low level.

Since the phase has been switched from the clock signal d2 (90) to the clock signal d3 (180), the phase switching control is performed next on the basis of the period of the clock signal d3 (180). From the end timing of the phase switching time interval t12 through to the start timing of the period PD13 of the clock signal d3 (180), the Low level of the switched clock signal d3 (180) is output as the Rth frequency clock signal D1.

Period PD13: During the phase switching time interval t13 in which the clock signals d3 (180) and d4 (270) are both Low, the rotary switch 30 switches the phase from the clock signal d3 (180) to the clock signal d4 (270).

From the start timing of the period PD13 through to the start timing of the phase switching time interval t13, the clock signal d3 (180) is output as the switched clock signal D0, and therefore, during this time, the Rth frequency clock signal D1 is identical with the clock signal d3 (180). During the phase switching time interval t13, the Rth frequency clock signal D1 remains at the Low level.

Since the phase has been switched from the clock signal d3 (180) to the clock signal d4 (270), the phase switching control is performed next on the basis of the period of the clock signal d4 (270). From the end timing of the phase switching time interval t13 through to the start timing of the period PD14 of the clock signal d4 (270), the Low level of the switched clock signal d4 (270) is output as the Rth frequency clock signal D1.

Period PD14: During the phase switching time interval t14 in which the clock signals d4 (270) and d1 (0) are both Low, the rotary switch 30 switches the phase from the clock signal d4 (270) to the clock signal d1 (0).

From the start timing of the period PD14 through to the start timing of the phase switching time interval t14, the clock signal d4 (270) is output as the switched clock signal D0, and accordingly, during this time, the Rth frequency clock signal D1 is identical with the clock signal d4 (270). During the phase switching time interval t14, the Rth frequency clock signal D1 remains at the Low level.

Since the phase has been switched from the clock signal d4 (270) to the clock signal d1 (0), the phase switching control is performed next on the basis of the period of the clock signal d1 (0). From the end timing of the phase switching time interval t14 through to the start timing of the period PD15 of the clock signal d1 (0), the Low level of the switched clock signal d1 (0) is output as the Rth frequency clock signal D1. The phase switching is repeated thereafter in like manner.

Because of the phase switching performed as described above, the Rth frequency clock signal D1 is derived as the combination of the two fifth frequency clock signals (in the Rth frequency clock signal D1 depicted in FIG. 14, for example, provided the leftmost clock period and the succeeding clock period are first and second clock periods, respectively, both the first and second clock periods are equivalent to the fifth frequency clock signal). The Rth frequency clock signal D1 is input to the ½ frequency divider 15 to be subjected to ½ frequency division, and accordingly, a tenth frequency clock signal derived by subjecting the input clock signal ck to ¹/₁₀ frequency division is output as the frequency divided clock signal DIVOUT.

Figure 15:
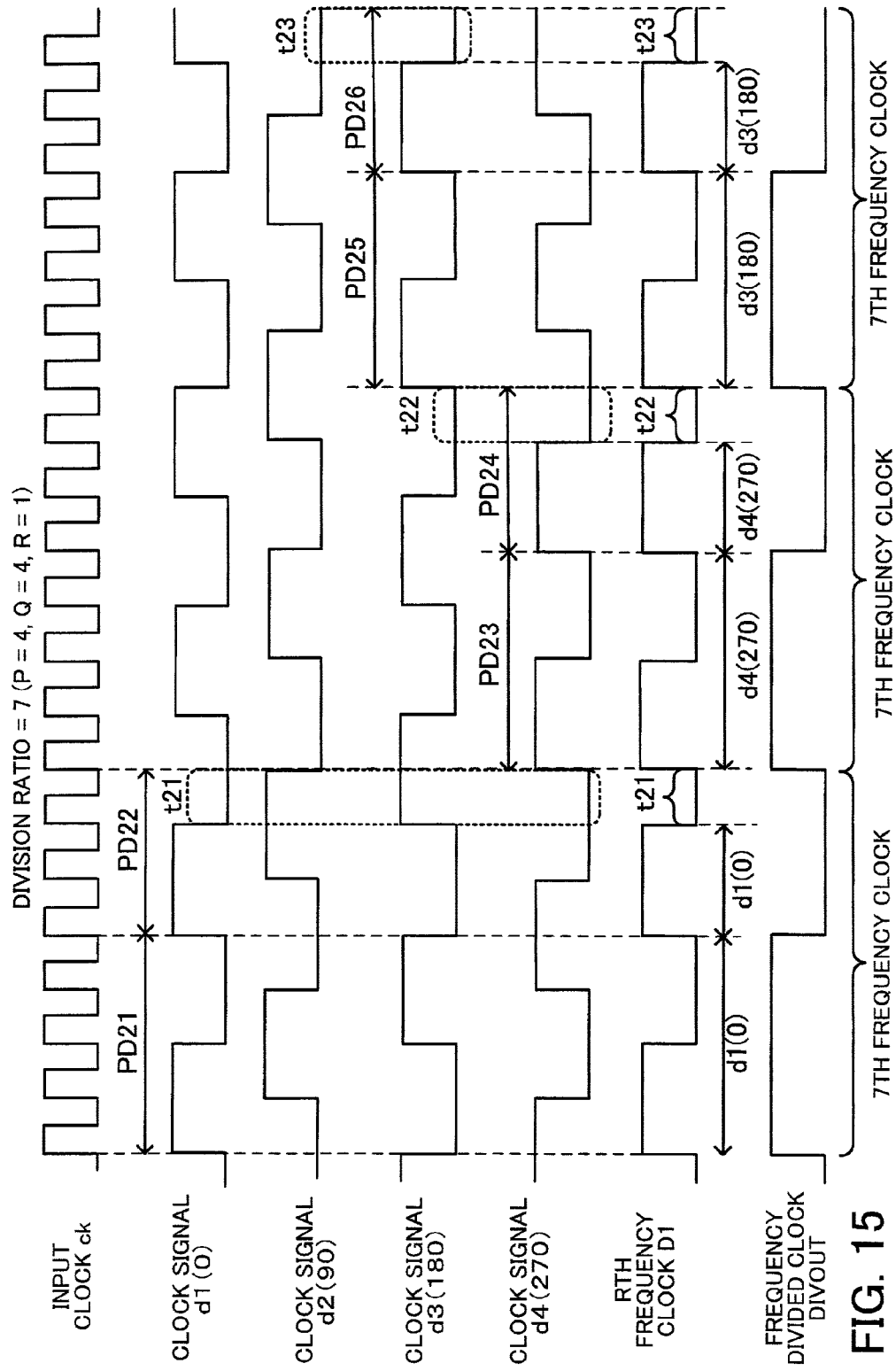
FIG. 15 is a timing chart illustrating a process of generating a frequency divided clock signal with a division ratio of "7"

FIG. 15 is a timing chart illustrating the process of generating the frequency divided clock signal DIVOUT with the division ratio "7". Where the division ratio=7, the rotary switch 30 switches the phase in the negative direction once in every two clock periods of the clock signals d1 to d4. For example, among periods PD21 to PD26 illustrated in FIG. 15, no phase switching is effected in the periods PD21, PD23 and PD25, and the phase switching is effected in the periods PD22, PD24 and PD26.

Period PD21: No phase switching is performed in this period. The clock signal d1 (0) is output from the rotary switch 30 as the switched clock signal D0. During the period PD21, therefore, the Rth frequency clock signal D1 is identical with the clock signal d1 (0).

Period PD22: In this period, the phase switching is executed. During the phase switching time interval t21 in which the clock signals d1 (0) and d4 (270) are both Low, the rotary switch 30 executes phase switching from the clock signal d1 (0) to the clock signal d4 (270).

From the start timing of the period PD22 through to the start timing of the phase switching time interval t21, the clock signal d1 (0) is output as the switched clock signal D0, and therefore, during this time, the Rth frequency clock signal D1 is identical with the clock signal d1 (0). During the phase switching time interval t21, the Rth frequency clock signal D1 is set to the Low level.

After the phase is switched from the clock signal d1 (0) to the clock signal d4 (270), the phase switching control is performed next on the basis of the period of the clock signal d4 (270) (since the period PD23 of the clock signal d4 (270) starts from the end timing of the phase switching time interval t21, the period PD22 of the clock signal d1 (0) is shorter than the period PD21).

Period PD23: No phase switching is executed in this period. The clock signal d4 (270) is output, and therefore, during the period PD23, the Rth frequency clock signal D1 is identical with the clock signal d4 (270).

Period PD24: In this period, the phase switching is executed. During the phase switching time interval t22 in which the clock signals d4 (270) and d3 (180) are both Low, the rotary switch 30 executes phase switching from the clock signal d4 (270) to the clock signal d3 (180).

From the start timing of the period PD24 through to the start timing of the phase switching time interval t22, the clock signal d4 (270) is output as the switched clock signal D0, and therefore, during this time, the Rth frequency clock signal D1 is identical with the clock signal d4 (270). During the phase switching time interval t22, the Rth frequency clock signal D1 is set to the Low level.

Since the phase has been switched from the clock signal d4 (270) to the clock signal d3 (180), the phase switching control is performed next on the basis of the period of the clock signal d3 (180) (since the period PD25 of the clock signal d3 (180) begins from the end timing of the phase switching time interval t22, the period PD24 of the clock signal d4 (270) is shorter than the period PD23). The phase switching is repeated thereafter in like manner.

Because of the phase switching executed as described above, the Rth frequency clock signal D1 is derived as the combination of the fourth and third frequency clock signals (in the Rth frequency clock signal D1 depicted in FIG. 15, for example, provided the leftmost clock period and the succeeding clock period are first and second clock periods, respectively, the first clock period is equivalent to the fourth frequency clock signal while the second clock period is equivalent to the third frequency clock signal). The Rth frequency clock signal D1 is input to the ½ frequency divider 15 to be subjected to ½ frequency division, and accordingly, a seventh frequency clock signal derived by subjecting the input clock signal ck to ⅐ frequency division is output as the frequency divided clock signal DIVOUT.

Figure 16:
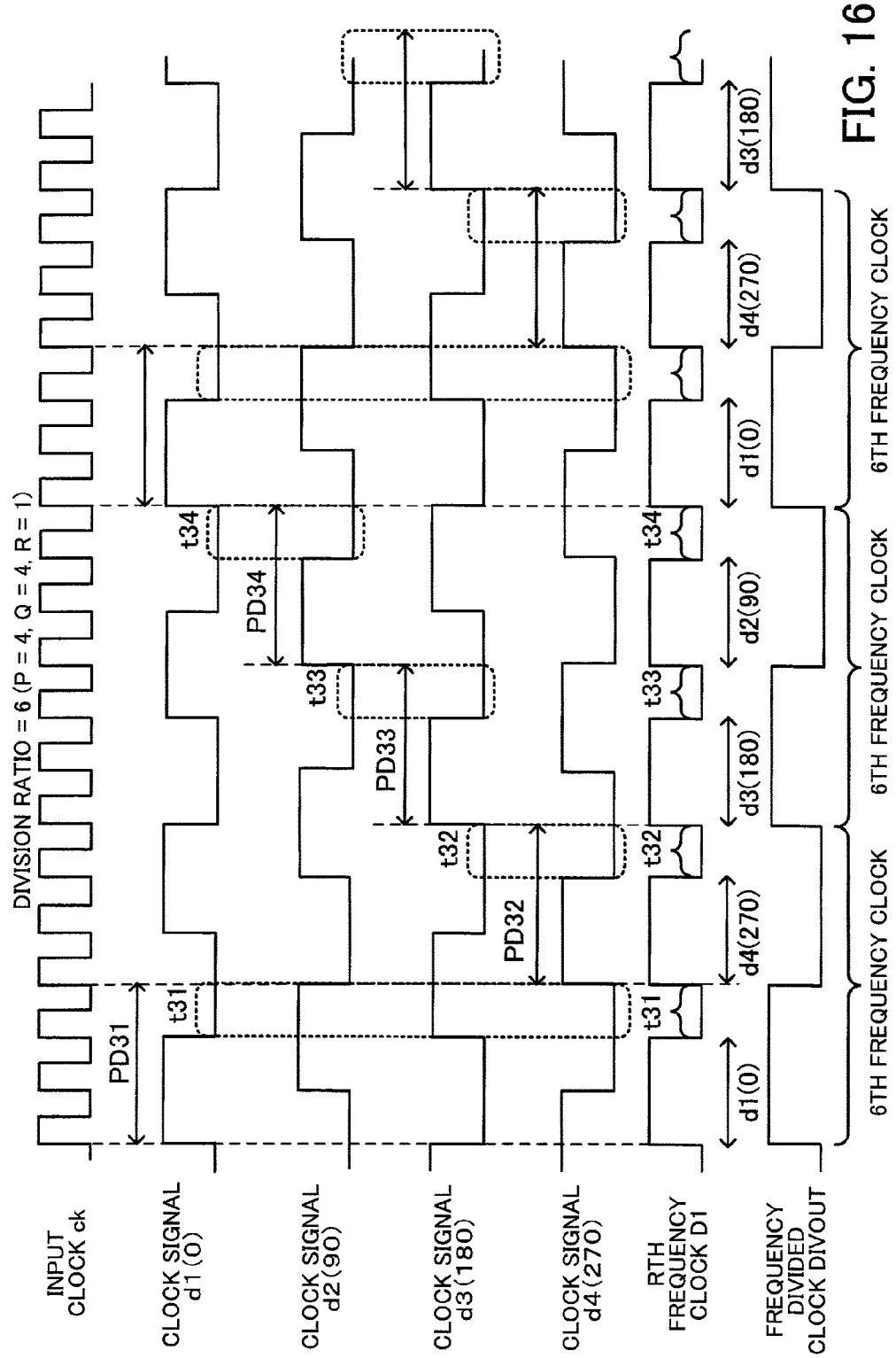
FIG. 16 is a timing chart illustrating a process of generating a frequency divided clock signal with a division ratio of "6"

FIG. 16 is a timing chart illustrating the process of generating the frequency divided clock signal DIVOUT with the division ratio "6". Where the division ratio=6, the rotary switch 30 switches the phase in the negative direction in every clock period of the clock signals d1 to d4. Namely, the phase switching is effected in each of periods PD31 to PD34 illustrated in FIG. 16.

Period PD31: During the phase switching time interval t31 in which the clock signals d1 (0) and d4 (270) are both Low, the rotary switch 30 executes phase switching from the clock signal d1 (0) to the clock signal d4 (270).

From the start timing of the period PD31 through to the start timing of the phase switching time interval t31, the clock signal d1 (0) is output as the switched clock signal D0, and therefore, during this time, the Rth frequency clock signal D1 is identical with the clock signal d1 (0). During the phase switching time interval t31, the Rth frequency clock signal D1 is set to the Low level.

After the phase is switched from the clock signal d1 (0) to the clock signal d4 (270), the phase switching control is performed next on the basis of the period of the clock signal d4 (270) (since the period PD32 of the clock signal d4 (270) begins from the end timing of the phase switching time interval t31, the period PD31 is shorter than the normal period of the clock signal d1 (0)).

Period PD32: During the phase switching time interval t32 in which the clock signals d4 (270) and d3 (180) are both Low, the rotary switch 30 executes phase switching from the clock signal d4 (270) to the clock signal d3 (180).

From the start timing of the period PD32 through to the start timing of the phase switching time interval t32, the clock signal d4 (270) is output as the switched clock signal D0, and therefore, during this time, the Rth frequency clock signal D1 is identical with the clock signal d4 (270). During the phase switching time interval t32, the Rth frequency clock signal D1 is set to the Low level.

Since the phase has been switched from the clock signal d4 (270) to the clock signal d3 (180), the phase switching control is performed next on the basis of the period of the clock signal d3 (180) (since the period PD33 of the clock signal d3 (180) starts from the end timing of the phase switching time interval t32, the period PD32 is shorter than the normal period of the clock signal d3 (180)).

Period PD33: During the phase switching time interval t33 in which the clock signals d3 (180) and d2 (90) are both Low, the rotary switch 30 executes phase switching from the clock signal d3 (180) to the clock signal d2 (90).

From the start timing of the period PD33 through to the start timing of the phase switching time interval t33, the clock signal d3 (180) is output as the switched clock signal D0, and therefore, during this time, the Rth frequency clock signal D1 is identical with the clock signal d3 (180). During the phase switching time interval t33, the Rth frequency clock signal D1 is set to the Low level.

Since the phase has been switched from the clock signal d3 (180) to the clock signal d2 (90), the phase switching control is performed next on the basis of the period of the clock signal d2 (90) (since the period PD34 of the clock signal d2 (90) begins from the end timing of the phase switching time interval t33, the period PD33 is shorter than the normal period of the clock signal d2 (90)). The phase switching is repeated thereafter in like manner.

Because of the phase switching executed as described above, the Rth frequency clock signal D1 is derived as the combination of the two third frequency clock signals (in the Rth frequency clock signal D1 depicted in FIG. 16, for example, provided the leftmost clock period and the succeeding clock period are first and second clock periods, respectively, both the first and second clock periods are equivalent to the third frequency clock signal). The Rth frequency clock signal D1 is input to the ½ frequency divider 15 to be subjected to ½ frequency division, and accordingly, a sixth frequency clock signal derived by subjecting the input clock signal ck to ⅙ frequency division is output as the frequency divided clock signal DIVOUT.

Figure 17:
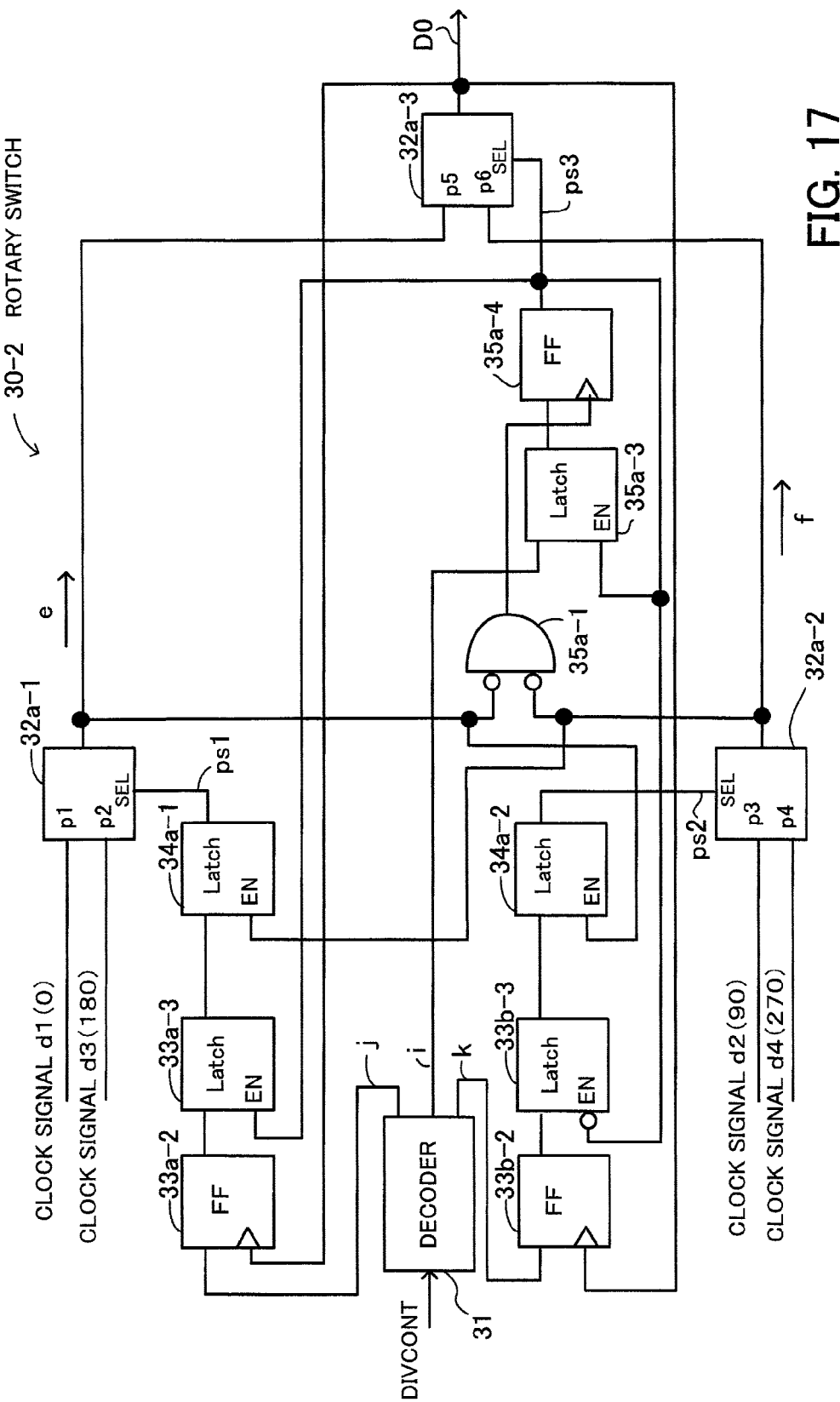
FIG. 17 illustrates the configuration of a rotary switch according to a modification.

Two modifications of the rotary switch 30 will be now described. FIG. 17 illustrates the configuration of a rotary switch according to the first modification. The aforementioned rotary switch 30 receives and decodes the division ratio control signal DIVCONT and, in accordance with the decoded value, carries out path switching to output the switched clock signal D0. The division ratio control signal DIVCONT is generated by the division ratio setter 20 on the basis of a signal obtained by subjecting the switched clock signal D0 to 1/R frequency division, a signal obtained by subjecting the Rth frequency clock signal D1 to ½ frequency division, and the division ratio set signal DIVSET, and accordingly, there is a possibility that delay fluctuates greatly depending on the operating environment and the like. If significant delay fluctuation occurs, the frequency division may possibly fail to be performed properly.

In the rotary switch 30-2 according to the first modification, therefore, the decoded value of the division ratio control signal DIVCONT is retimed by means of internal timing of the rotary switch 30-2 to restrain timing error from occurring in the rotary switch due to delay fluctuation of the division ratio control signal DIVCONT, thereby preventing malfunction.

The rotary switch 30-2 of the first modification comprises the decoder 31, the 2:1 selectors 32a-1, 32a-2 and 32a-3, flip-flops 33a-2, 33b-2 and 35a-4, latches 33a-3, 33b-3, 34a-1, 34a-2 and 35a-3, and the NAND gate 35a-1.

The 2:1 selectors 32a-1, 32a-2 and 32a-3 correspond respectively to the path switches 32-1, 32-2 and 32-3. The latches 34a-1 and 34a-2 correspond respectively to the glitch-avoidance timing controllers 34-1 and 34-2.

The NAND gate 35a-1, the latch 35a-3 and the flip-flop 35a-4 altogether function as the pulse splitting-avoidance timing controller 35. The flip-flop 33a-2 and the latch 33a-3 function as the switching trigger generator 3-1, and the flip-flop 33b-2 and the latch 33b-3 function as the switching trigger generator 3-2. The flip-flops 33a-2 and 33b-2 correspond respectively to first and second retiming circuits.

The decoder 31 decodes the division ratio control signal DIVCONT and outputs the signals i, j and k. The signal j is input to the flip-flop 33a-2, the signal k is input to the flip-flop 33b-2, and the signal i is input to the latch 35a-3.

In the 2:1 selector 32a-1, the terminal p1 is input with the clock signal d1 (0), the terminal p2 is input with the clock signal d3 (180), and the select terminal SEL is input with the path switching signal ps1 output from the latch 34a-1.

In the 2:1 selector 32a-2, the terminal p3 is input with the clock signal d2 (90), the terminal p4 is input with the clock signal d4 (270), and the select terminal SEL is input with the path switching signal ps2 output from the latch 34a-2.

In the 2:1 selector 32a-3, the terminal p5 is input with the signal e output from the 2:1 selector 32a-1, the terminal p6 is input with the signal f output from the 2:1 selector 32a-2, and the select terminal SEL is input with the path switching signal ps3 output from the flip-flop 35a-4.

The switched clock signal D0 output from the 2:1 selector 32a-3 is input to the clock terminals of the respective flip-flops 33a-2 and 33b-2. The enable terminals of the latches 33a-3 and 33b-3 are input with the path switching signal ps3. The latch 33a-3 is a positively enabled type while the latch 33b-3 is a negatively enabled type so that the latches may be selected in a mutually exclusive manner.

Specifically, when the latch 33a-3 is enabled by the path switching signal ps3 to hold/output the signal j, the latch 33b-3 is disenabled and does not update the output of the signal k. On the other hand, when the latch 33b-3 is enabled by the path switching signal ps3 to hold/output the signal k, the latch 33a-3 is disenabled and does not update the output of the signal j.

The signal j output from the latch 33a-3 is applied to the latch 34a-1, of which the enable terminal is input with the signal f. The signal k output from the latch 33b-3 is applied to the latch 34a-2, of which the enable terminal is input with the signal e. The signals e and f are input to the respective two input terminals of the NAND gate 35a-1, of which the output signal is supplied to the clock terminal of the flip-flop 35a-4.

With the circuit configuration described above, the decoded value of the division ratio control signal DIVCONT is always retimed by means of the switched clock signal D0, which is the final output signal of the rotary switch, to carry out the path switching in response to the retimed path switching signal. Thus, even if delay fluctuation occurs in the input division ratio control signal DIVCONT, the division ratio control signal can be retimed inside the rotary switch 30-2, making it possible to prevent the frequency division from being performed improperly.

Namely, even if the transition time of data input to the decoder varies due to process fluctuation or change of the operating environment, it is possible to avoid an anomalous situation where the frequency is divided in a ratio different from the set division ratio.

The following describes the rotary switch according to the second modification, wherein the path switches in the rotary switch 30 are each constituted by a differentiation circuit. Usually, a CMOS differentiation device is used to constitute such a differentiation circuit. Many of CMOS differentiation devices, however, are not configured to use a common signal source for the differentiation and occasionally fail to provide normal differential outputs. Thus, where such a CMOS differentiation device is used to constitute the differentiation circuit, malfunction possibly occurs. First, the cause of faulty operation will be explained with reference to an exemplary case where a CMOS inverter is used as the CMOS differentiation device.

A CMOS inverter is a circuit comprising an NMOS-PMOS pair, wherein the gates are connected to each other, the drains are also connected to each other, the source of the NMOS is connected to the ground (GND) potential, and the source of the PMOS is connected to the power supply potential. The gates serve as the input terminal, and the drains as the output terminal.

Figure 18:
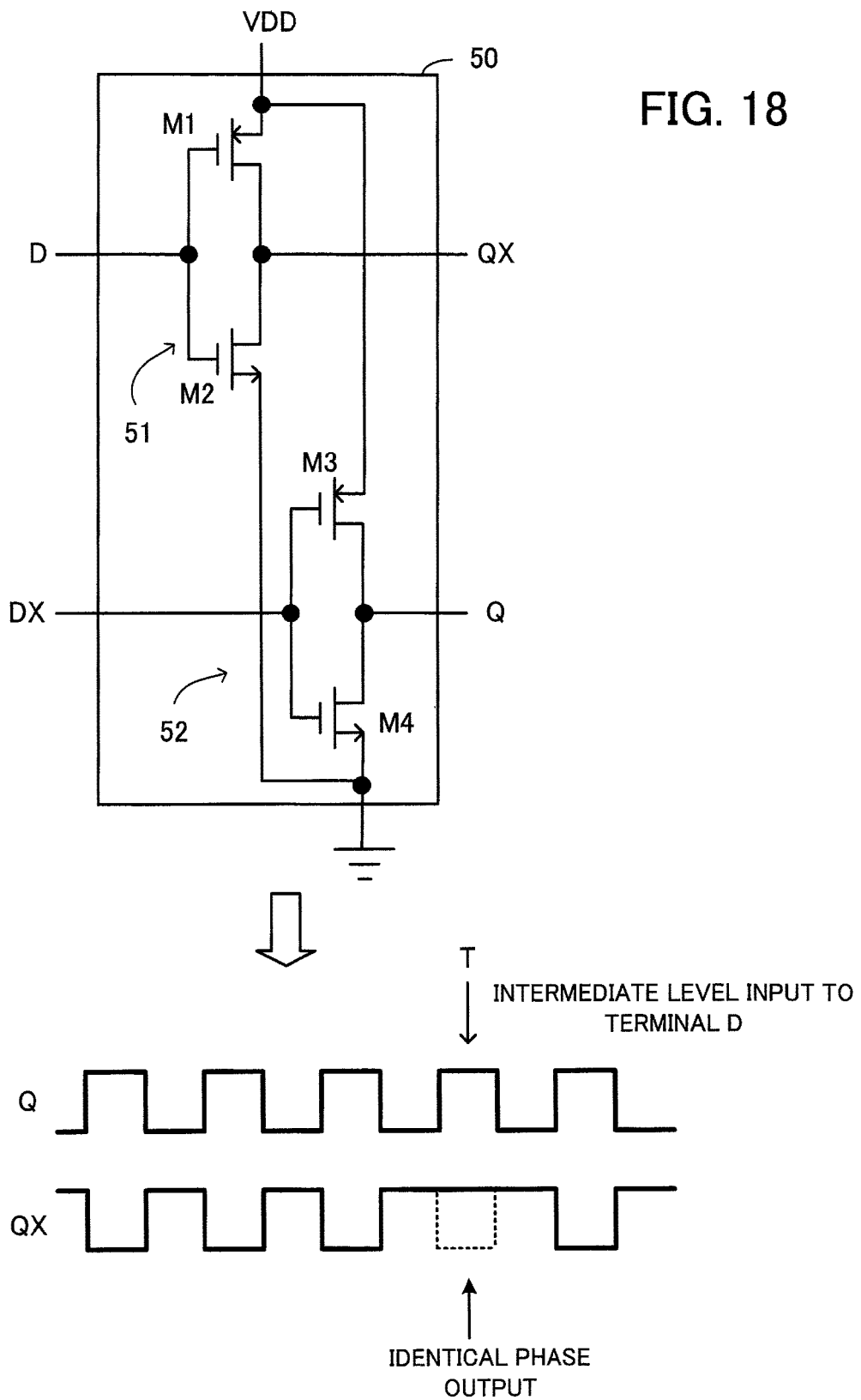
FIG. 18 illustrates a cause of faulty operation attributable to a CMOS inverter.

FIG. 18 illustrates the cause of faulty operation attributable to the CMOS inverter. The CMOS inverter 50 is constituted by separate inverters 51 and 52. The inverter 51 includes a P-channel transistor M1 and an N-channel transistor M2, and the inverter 52 includes a P-channel transistor M3 and an N-channel transistor M4.

In the inverter 51, the source of the transistor M1 is connected to VDD, and the gate of the transistor M1 is connected to the gate of the transistor M2 as well as to the input terminal D. The source of the transistor M2 is connected to GND, and the drain of the transistor M2 is connected to the drain of the transistor M1 as well as to the output terminal QX.

In the inverter 52, the source of the transistor M3 is connected to VDD, and the gate of the transistor M4 is connected to the gate of the transistor M3 as well as to the input terminal DX. The source of the transistor M4 is connected to GND, and the drain of the transistor M4 is connected to the drain of the transistor M3 as well as to the output terminal Q.

Thus, the CMOS inverter 50 is a differentiation circuit constituted by the mutually independent inverters 51 and 52, and therefore, depending on the input signal levels, the output terminals Q and QX fail to provide outputs that are normally inverted with respect to each other. At timing T, for example, if an intermediate-level signal is input from the input terminal D, the output terminal QX outputs a High-level signal identical with that output from the output terminal Q, though the output level should be Low, with the result that normally inverted outputs fail to be derived.

Accordingly, the rotary switch of the second modification using CMOS differentiation devices is configured such that normally inverted outputs can be derived even if an intermediate-level signal is input as one of the two input signals, thereby avoiding malfunction.

Figure 19:
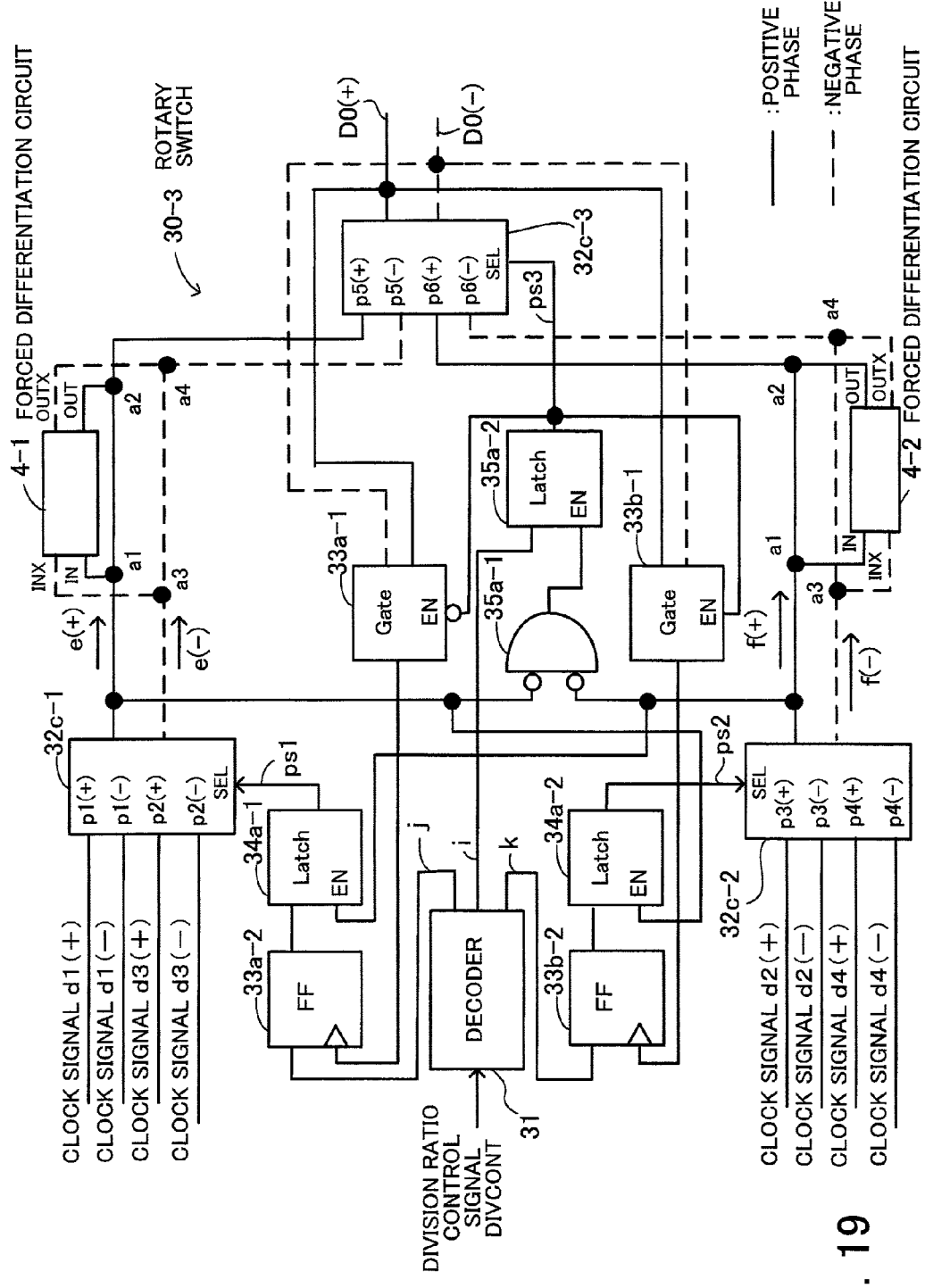
FIG. 19 illustrates the configuration of a rotary switch according to another modification.

FIG. 19 illustrates the configuration of the rotary switch according to the second modification. The rotary switch 30-3 of the second modification comprises the decoder 31, 2:1 selectors 32c-1, 32c-2 and 32c-3, the gates 33a-1 and 33b-1, the flip-flops 33a-2 and 33b-2, the latches 34a-1, 34a-2 and 35a-2, the NAND gate 35a-1, and forced differentiation circuits (cross-coupled circuits) 4-1 and 4-2.

In the rotary switch 30-3, the path switches are each constituted by a differentiation circuit, and the forced differentiation circuit is connected to the output side of the differentiation circuit. Since the basic circuit configuration of the rotary switch 30-3 is identical with that of the rotary switch 30-1 illustrated in FIG. 11, only the differences will be explained.

The 2:1 selector 32c-1 has a terminal p1(+) input with the clock signal d1(+), a terminal p1(−) input with the clock signal d1(−), a terminal p2(+) input with the clock signal d3 (+), a terminal p2(−) input with the clock signal d3 (−), and a select terminal SEL input with the path switching signal ps1 output from the latch 34a-1.

The 2:1 selector 32c-2 has a terminal p3(+) input with the clock signal d2(+), a terminal p3(−) input with the clock signal d2(−), a terminal p4(+) input with the clock signal d4 (+), a terminal p4(−) input with the clock signal d4 (−), and a select terminal SEL input with the path switching signal ps2 output from the latch 34a-2.

In the 2:1 selector 32c-3, terminals p5(+) and p5(−) are input with the signals e(+) and e(−), respectively, and terminals p6(+) and p6(−) are input with the signals f(+) and f(−), respectively. The select terminal SEL of the 2:1 selector 32c-3 is input with the path switching signal ps3 output from the latch 35a-2.

The switched clock signals D0(+) and D0(−) output from the 2:1 selector 32c-3 are input to the gates 33a-1 and 33b-1. The positive-phase signals e(+) and f(+) are input to the respective input terminals of the NAND gate 35a-1 and also to the enable terminals of the latches 34a-2 and 34a-1, respectively.

The forced differentiation circuit 4-1 has input and output terminals IN and OUT connected to a line through which the signal e(+) passes, and has input and output terminals INX and OUTX connected to a line through which the signal e(−) passes.

The forced differentiation circuit 4-2 has input and output terminals IN and OUT connected to a line through which the signal f(+) passes, and has input and output terminals INX and OUTX connected to a line through which the signal f(−) passes.

Figure 20:
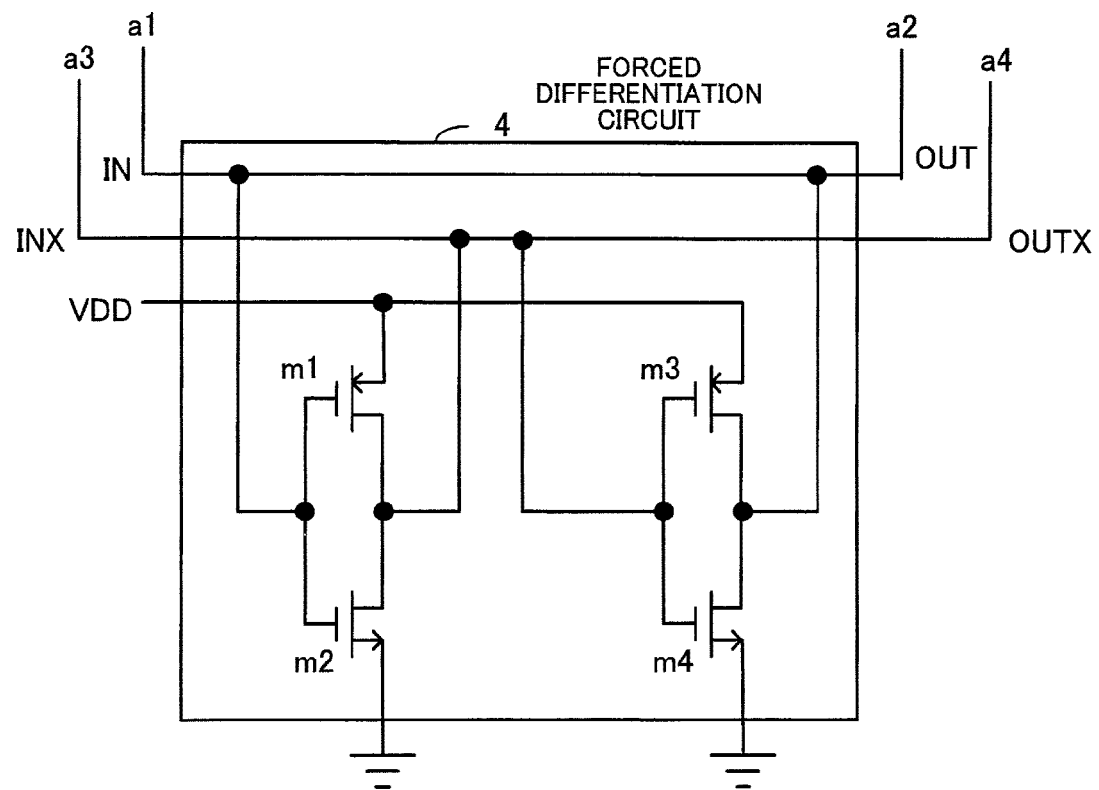
FIG. 20 illustrates the configuration of a forced differentiation circuit.

FIG. 20 illustrates the configuration of the forced differentiation circuit. The forced differentiation circuit 4 includes transistors m1 to m4. The source of the transistor m1 is connected to the source of the transistor m3 as well as to VDD. The gate of the transistor m1 is connected to the gate of the transistor m2, the input terminal IN, the output terminal OUT, and the drains of the transistors m3 and m4.

The source of the transistor m2 is connected to GND. The drain of the transistor m2 is connected to the drain of the transistor m1, the input terminal INX, the output terminal OUTX, and the gates of the transistors m3 and m4. The source of the transistor m4 is connected to GND.

Suppose that, although the terminals IN and INX of the forced differentiation circuit 4 are to be applied with Low- and High-level signals, respectively, an intermediate-level signal is input to the terminal IN. In this case, since the gate of the transistor m4 is connected to the terminal INX and thus applied with the High-level signal, the transistor m4 turns on, causing the terminal OUT to output a Low-level signal.

Thus, even in the case where an intermediate-level signal is input to one of the input terminals IN and INX with a normal High- or Low-level signal input to the other, it is possible to prevent signals with an identical phase from being output, and normally inverted signals can be output as differential outputs.

In the configuration illustrated in FIG. 19, the forced differentiation circuits 4-1 and 4-2 are arranged on the output side of the 2:1 selectors 32c-1 and 32c-2, respectively, so that the signals input to the 2:1 selector 32c-3 may not have an intermediate level. In addition, another forced differentiation circuit may be arranged on the output side of the 2:1 selector 32c-3.

In this manner, where each path switch is configured to be applied with differential clock signals, all or some of the path switches are each connected at their output side with a forced differentiation circuit having a cross-coupled configuration, which comprises a pair of CMOS inverters whose input terminals are connected with the positive- and negative-phase input lines, respectively, and whose output terminals are connected to the negative- and positive-phase output lines, respectively.

It is therefore possible to avoid an anomalous operation wherein the logic levels of the positive- and negative-phase outputs fail to maintain their inversion relationship because of insufficient switching time that can be caused by timing error of the switching trigger or the like due to process fluctuation during the high-speed frequency division operation or due to change of the operating environment.

In addition to the above explanation of the frequency division where Q=4, a case where Q is an odd number and a case where Q is an even number will now be explained.

Figure 21:
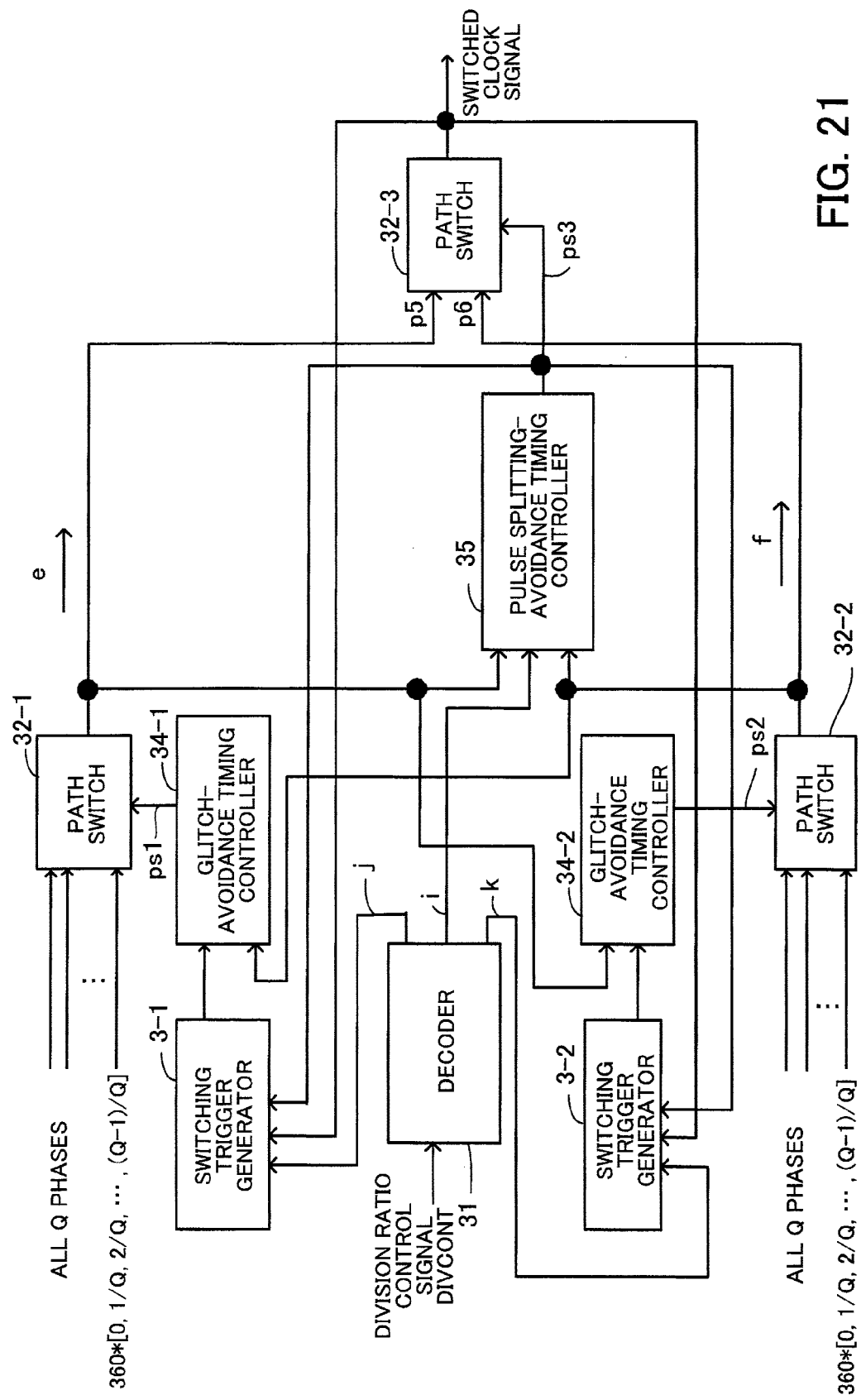
FIG. 21 illustrates the configuration of a rotary switch.

FIG. 21 illustrates the configuration of a rotary switch. FIG. 21 exemplifies a case where Q is an odd number (=2×S−1) and S is an integer number of 2 or greater.

Assume that Q=3. The path switches 32-1 and 32-2 have inputs of 0 (path switch 32-1), 120 (path switch 32-2), 240 (path switch 32-1), 0 (path switch 32-2), 120 (path switch 32-1), 240 (path switch 32-2), . . . . Therefore, each of the path switches 32-1 and 32-2 needs a Q:1 selector which selects one phase from all of the Q phases. Each of a path switching signal ps1 (a signal j and an output of a switching trigger generator 3-1 as well) and a path switching signal ps2 (a signal k and an output of a switching trigger generator 3-2 as well) is a multi-bit signal so as to distinguish among Q kinds of signals.

Figure 22:
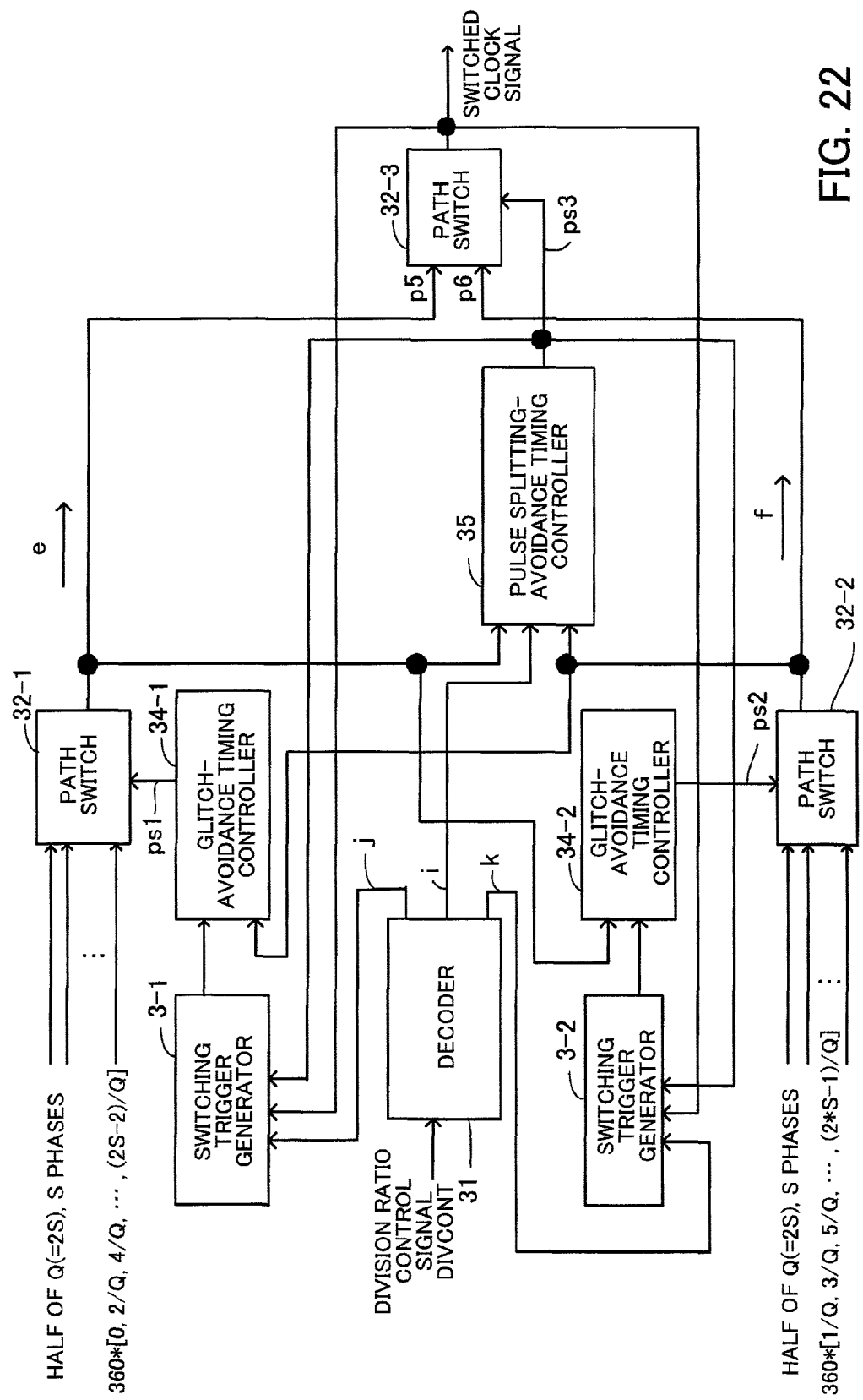
FIG. 22 illustrates the configuration of a rotary switch.
Figure 23:
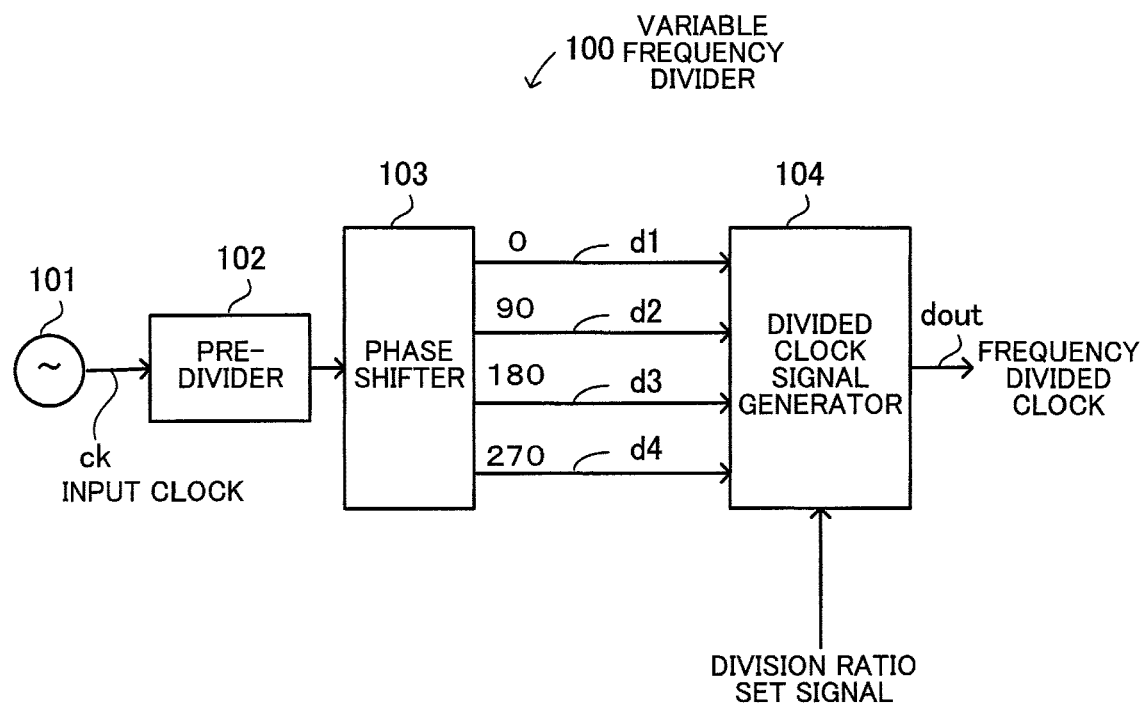
FIG. 23 illustrates the configuration of a conventional variable frequency divider.
Figure 24:
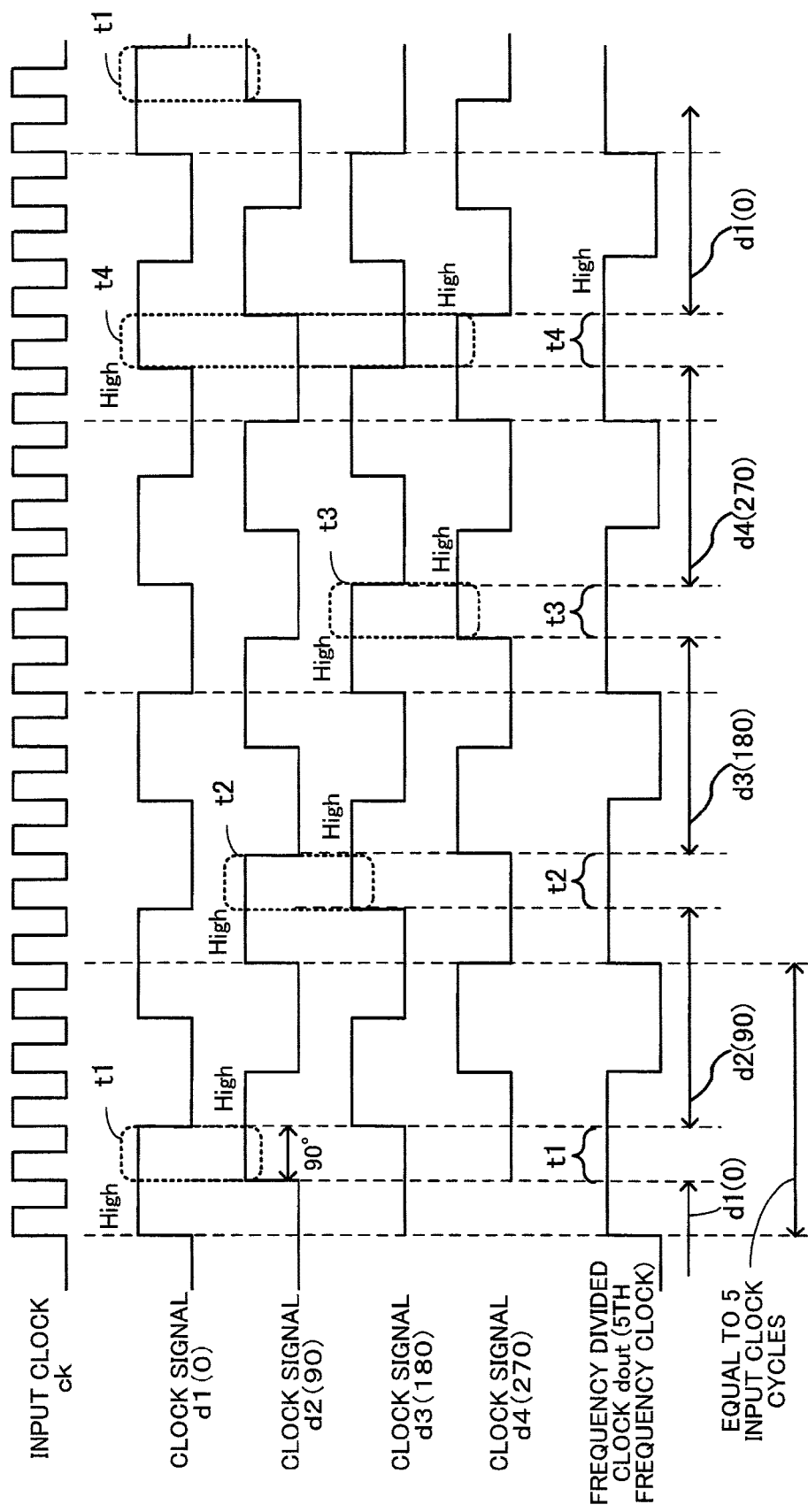
FIG. 24 illustrates a frequency division operation for obtaining a fifth frequency clock signal.
Figure 25:
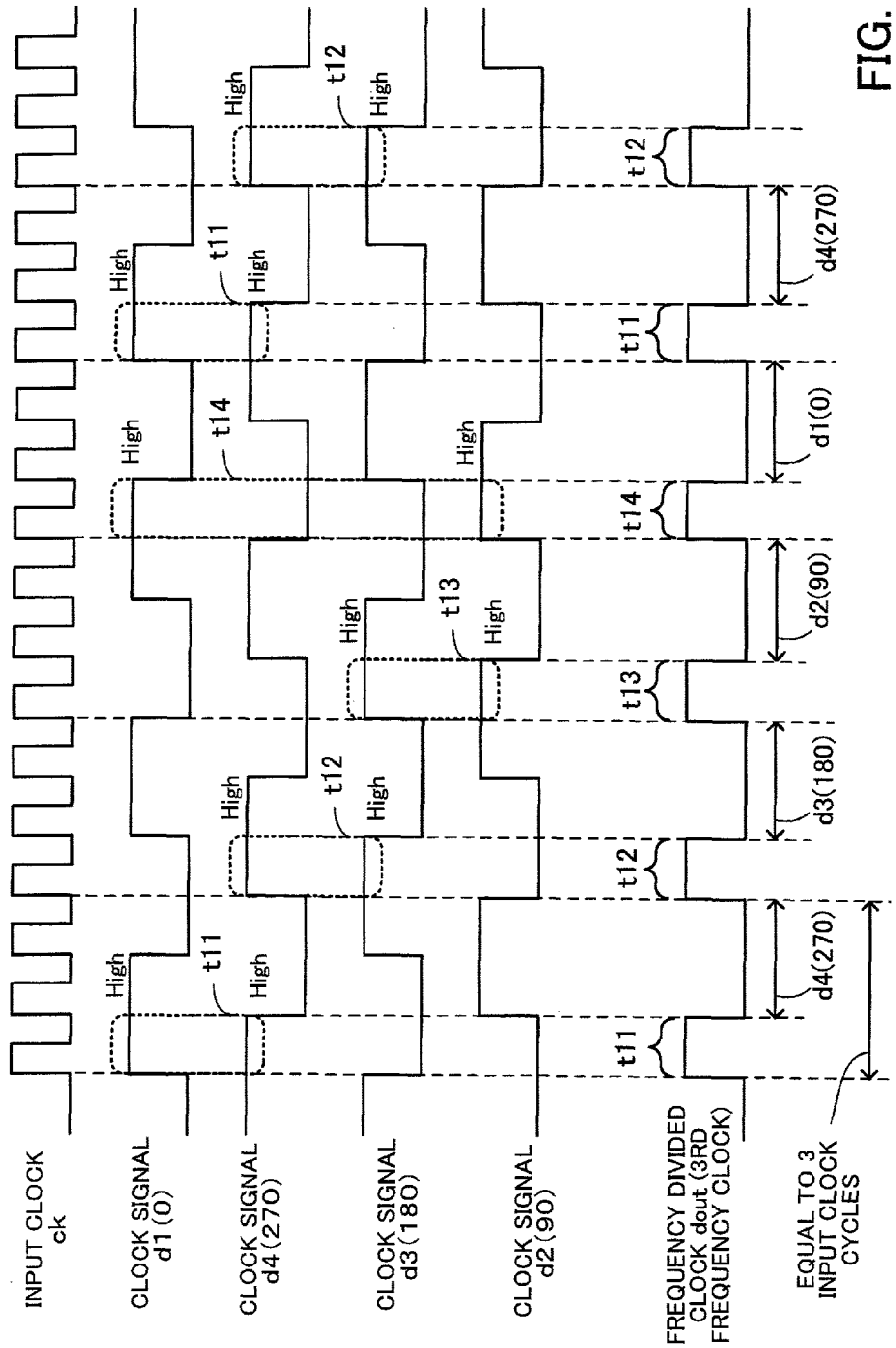
FIG. 25 illustrates a frequency division operation for obtaining a third frequency clock signal.
Figure 26:
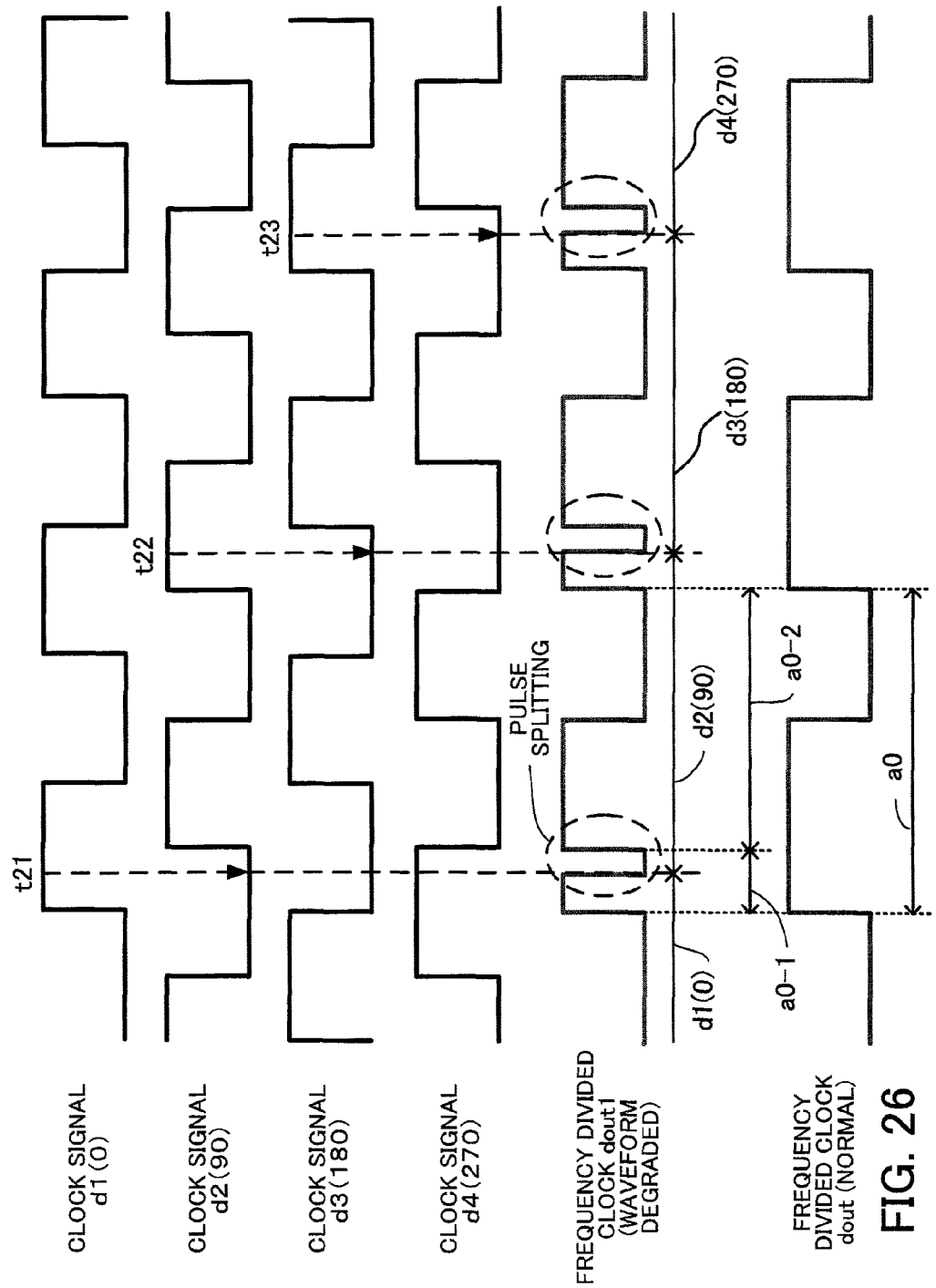
FIG. 26 illustrates phase switching accompanying pulse splitting.

FIG. 22 illustrates the configuration of a rotary switch. FIG. 22 exemplifies a case where Q is an even number (=2×S) and S is an integer number of 2 or greater.

Assume that Q=6. The path switches 32-1 and 32-2 have inputs of 0 (path switch 32-1), 60 (path switch 32-2), 120 (path switch 32-1), 180 (path switch 32-2), 240 (path switch 32-1), 0 (path switch 32-2), 0 (path switch 32-1), 60 (path switch 32-2), 120 (path switch 32-1). Therefore, each of the path switches 32-1 and 32-2 does not need a selector for all of the Q phases, but needs a S:1 selector which selects one phase from a half of the Q phases, or S phases (i.e., from 3 phases, 0, 120, and 240, in the path switch 32-1). Each of a path switching signal ps1 (a signal j and an output of a switching trigger generator 3-1 as well) and a path switching signal ps2 (a signal k and an output of a switching trigger generator 3-2 as well) is a multi-bit signal so as to distinguish among S kinds of signals.

FIGS. 9, 11, and 17 exemplifies the case where Q=4, which is considered to provide the wide applications and high practicability. In this case, Q is an even number and S=2. Therefore, a 1-bit signal is sufficient for use as a path switching signal ps1 and a path switching signal ps2.

The frequency dividing device disclosed herein is simple in circuit configuration and capable of variably setting the division ratio. It is also possible to prevent pulse splitting of the frequency divided clock signal as well as the occurrence of glitches in the internal circuit, thus enabling high-accuracy variable frequency division.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has (have) been described in detail, it should be understood that various changes, substitutions and alterations could be made hereto without departing from the spirit and scope of the invention.

What is claimed is:

1. A frequency dividing device for performing variable frequency division, comprising:
   a clock source configured to generate an input clock signal;
   a 1/P frequency divider configured to subject the input clock signal to 1/P frequency division to obtain a 1/P frequency signal;
   a phase shifter configured to shift phase of the 1/P frequency signal and output a plurality of different Q-phase signals;
   a switch configured to perform phase switching by switching the Q-phase signals from one to another in accordance with a division ratio control signal;
   a 1/R frequency divider configured to subject a switched clock signal output from the switch to 1/R frequency division and output an Rth frequency clock signal;
   a ½ frequency divider configured to subject the Rth frequency clock signal to ½ frequency division and output a frequency divided clock signal; and
   a division ratio setter configured to receive a division ratio set signal indicative of an externally instructed division ratio and generate, based on the division ratio set signal, the Rth frequency clock signal and the frequency divided clock signal, the division ratio control signal for controlling the phase switching,
   wherein P, Q, and R are integers satisfying $P \geq 1$, $Q \geq 3$ and $R \geq 1$, and the frequency dividing device allows any one of five values indicated by P×R×2, P×R×2±1×P/Q, and P×R×2±2×P/Q to be set as the division ratio in which frequency of the input clock signal is divided, and outputs the frequency divided clock signal with the set division ratio,
   wherein the division ratio setter is configured to:
   perform three-choice selection control to select, out of two clock pulses of the Rth frequency clock signal contained in one period of the frequency divided clock signal, one or both or neither of the two clock pulses;
   decode the division ratio set signal to acquire a polarity bit;
   generate the division ratio control signal for setting the division ratio of P×R×2 when neither of the two clock pulses is selected;
   generate the division ratio control signal for setting the division ratio of P×R×2−1×P/Q when one of the two clock pulses is selected and also the polarity bit is "0";
   generate the division ratio control signal for setting the division ratio of P×R×2+1×P/Q when one of the two clock pulses is selected and also the polarity bit is "1";
   generate the division ratio control signal for setting the division ratio of P×R×2−2×P/Q when both of the two clock pulses are selected and also the polarity bit is "0"; and
   generate the division ratio control signal for setting the division ratio of P×R×2+2×P/Q when both of the two clock pulses are selected and also the polarity bit is "1".

2. The frequency dividing device according to claim 1, wherein the division ratio setter includes:
   a decoder configured to decode the division ratio set signal to generate the polarity bit and first and second division ratio set bits;
   a selector configured to select the first or second division ratio set bit in accordance with a logic level of the frequency divided clock signal, and output the selected first or second division ratio set bit as a gate signal;

a latch configured to permit or block passage of the Rth frequency clock signal in accordance with a logic level of the gate signal, to generate a trigger signal indicative of one of three choices selected by the three-choice selection control; and a counter configured to receive the trigger signal and the polarity bit, decrement a count value thereof in response to the trigger signal input when the polarity bit is "0", increment the count value in response to the trigger signal input when the polarity bit is "1", and output the count value as the division ratio control signal.

3. A frequency dividing device for performing variable frequency division, comprising:

a clock source configured to generate an input clock signal;

a 1/P frequency divider configured to subject the input clock signal to 1/P frequency division to obtain a 1/P frequency signal;

a phase shifter configured to shift phase of the 1/P frequency signal and output a plurality of different Q-phase signals;

a switch configured to perform phase switching by switching the Q-phase signals from one to another in accordance with a division ratio control signal;

a 1/R frequency divider configured to subject a switched clock signal output from the switch to 1/R frequency division and output an Rth frequency clock signal;

a ½ frequency divider configured to subject the Rth frequency clock signal to ½ frequency division and output a frequency divided clock signal; and a division ratio setter configured to receive a division ratio set signal indicative of an externally instructed division ratio and generate, based on the division ratio set signal, the Rth frequency clock signal and the frequency divided clock signal, the division ratio control signal for controlling the phase switching, wherein P, Q, and R are integers satisfying P≧1, Q≧3 and R≧1, and the frequency dividing device allows any one of five values indicated by P×R×2, P×R×2±1×P/Q, and P×R×2±2×P/Q to be set as the division ratio in which frequency of the input clock signal is divided, and outputs the frequency divided clock signal with the set division ratio, wherein the phase shifter is configured to perform a phase shift of Q=4 to output a clock signal (0) with a phase difference of 0°, a clock signal (90) with a phase difference of 90°, a clock signal (180) with a phase difference of 180°, and a clock signal (270) with a phase difference of 270°, and the switch includes:

a decoder configured to decode the division ratio control signal to generate first, second and third path switching signals;

a first path switch configured to perform path switching in accordance with the first path switching signal, to output one of the clock signals (0) and (180) as a first clock signal;

a second path switch configured to perform path switching in accordance with the second path switching signal, to output one of the clock signals (90) and (270) as a second clock signal; and a third path switch configured to perform path switching in accordance with the third path switching signal, to output one of the first and second clock signals as the switched clock signal.

4. The frequency dividing device according to claim 3, wherein the switch further includes:

a pulse splitting-avoidance timing controller configured to restrain occurrence of pulse splitting in the switched clock signal;

a first switching trigger generator configured to generate a first switching trigger after completion of the path switching by the second path switch, to cause the first path switch to execute the path switching;

a second switching trigger generator configured to generate a second switching trigger after completion of the path switching by the first path switch, to cause the second path switch to execute the path switching;

a first glitch-avoidance timing controller configured to restrict path switching operation of the first path switch such that the first and second clock signals do not simultaneously undergo a transition, to restrain occurrence of glitch; and a second glitch-avoidance timing controller configured to restrict path switching operation of the second path switch such that the first and second clock signals do not simultaneously undergo a transition, to restrain occurrence of glitch, the pulse splitting-avoidance timing controller permits the third path switching signal to be applied to the third path switch only when the first and second clock signals have an identical level, to execute the phase switching, the first switching trigger generator determines based on a logic level of the third path switching signal whether or not the second clock signal is currently selected by the third path switch and, if the second clock signal is being selected and output as the switched clock signal, holds the first path switching signal just after output from the decoder, with use of the switched clock signal, such that the held first path switching signal is output as the first switching trigger, the first glitch-avoidance timing controller holds the first path switching signal output from the first switching trigger generator, with use of the second clock signal, such that the first path switching signal is applied to the first path switch when a logic level of the second clock signal output from the second path switch is High or Low that is determined in advance according to circuit configuration, the second switching trigger generator determines based on the logic level of the third path switching signal whether or not the first clock signal is currently selected by the third path switch and, if the first clock signal is being selected and output as the switched clock signal, holds the second path switching signal just after output from the decoder, with use of the switched clock signal, such that the held second path switching signal is output as the second switching trigger, and the second glitch-avoidance timing controller holds the second path switching signal output from the second switching trigger generator, with use of the first clock signal, such that the second path switching signal is applied to the second path switch when a logic level of the first clock signal output from the first path switch is High or Low that is determined in advance according to the circuit configuration.

5. The frequency dividing device according to claim 3, wherein the switch is configured to restrain timing error attributable to delay fluctuation of the division ratio control signal and further includes:

a first retiming circuit configured to retime the first path switching signal with use of the switched clock signal; and a second retiming circuit configured to retime the second path switching signal with use of the switched clock signal.

6. The frequency dividing device according to claim 3, wherein the first, second and third path switches are each constituted by a differentiation circuit, at least the first and second path switches are each connected, at an output side thereof, with a forced differentiation circuit, and when a signal with a normal level indicative of a High or Low level is input to a first input terminal of the forced differentiation circuit and also a signal with an intermediate level between the High and Low levels is input to a second input terminal of the force differentiation circuit, the forced differentiation circuit corrects the intermediate level to a level inverted with respect to the normal level, to output the signal with the normal level from a first output terminal thereof and output, from a second output terminal thereof, a signal with the level inverted with respect to the signal input to the first input terminal.

* * * * *